United States Patent
Yamazaki

(10) Patent No.: US 9,082,861 B2
(45) Date of Patent: Jul. 14, 2015

(54) TRANSISTOR WITH OXIDE SEMICONDUCTOR CHANNEL HAVING PROTECTIVE LAYER

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 126 days.

(21) Appl. No.: 13/654,889

(22) Filed: Oct. 18, 2012

(65) Prior Publication Data
US 2013/0119373 A1 May 16, 2013

(30) Foreign Application Priority Data
Nov. 11, 2011 (JP) ................................ 2011-247941

(51) Int. Cl.
H01L 21/00 (2006.01)
H01L 21/84 (2006.01)
H01L 29/786 (2006.01)

(52) U.S. Cl.
CPC .................................. H01L 29/7869 (2013.01)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Kamiya et al., "Carrier Transport Properties and Electronic Structures of Amorphous Oxide Semiconductors: the present status," Solid State Physics, Sep. 1, 2009, vol. 44, No. 9, pp. 621-633, Agne Gijutsu Center.

(Continued)

*Primary Examiner* — Davienne Monbleau
*Assistant Examiner* — Shaka White
(74) *Attorney, Agent, or Firm* — Eric J. Robinson; Robinson Intellectual Property Law Office, P.C.

(57) ABSTRACT

A highly reliable semiconductor device is provided. Over an oxide semiconductor layer in which a channel is formed, an insulating layer including the oxide semiconductor material having a higher insulating property than an oxide semiconductor layer is formed. A material which contains an element M and is represented by a chemical formula $InMZnO_X$ (X>0) or an oxide material which contains an element $M_1$ and an element $M_2$ and is represented by a chemical formula $InM_{1X}M_{2(1-X)}ZnO$ (0<X<1+α where α is less than 0.3 and (1−X)>0) is used as the oxide semiconductor material having a high insulating property. Ti, Zr, Hf, Ge, Ce, or Y is used as the element M and the element $M_2$, for example. Ga is used as the element $M_1$, for example.

13 Claims, 14 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063211 A1* | 3/2007 | Iwasaki ........................ 257/98 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127266 A1* | 5/2010 | Saito et al. ........................ 257/59 |
| 2010/0148170 A1* | 6/2010 | Ueda et al. ........................ 257/43 |
| 2010/0276688 A1* | 11/2010 | Yano et al. ........................ 257/43 |
| 2012/0146109 A1 | 6/2012 | Yamazaki et al. |
| 2013/0082252 A1 | 4/2013 | Yamazaki |
| 2013/0082253 A1 | 4/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 | 9/2011 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, may 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys, Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th Internaitonal Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest —09 : SID International Symposium Digest of Technical Papers, may 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009 pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1976.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU,or ZN] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric layers,", J. Electrochem. Soc, (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

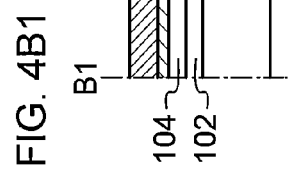
FIG. 4A1
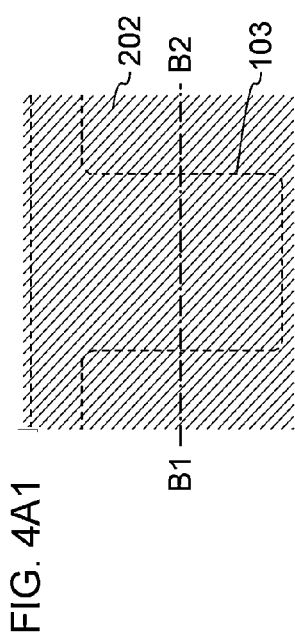
FIG. 4B1
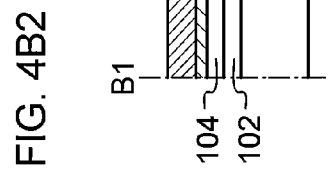
FIG. 4A2
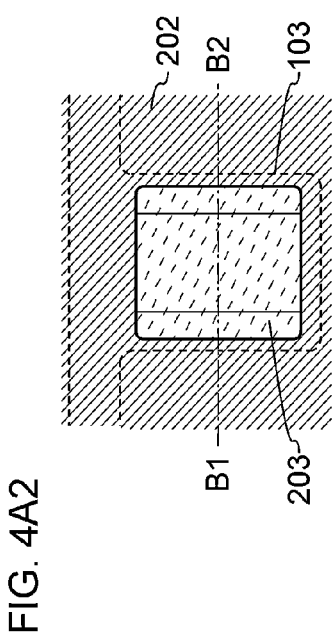
FIG. 4B2
FIG. 4A3
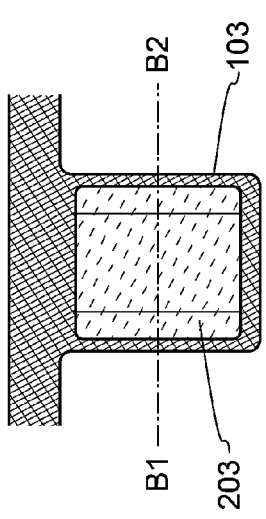
FIG. 4B3

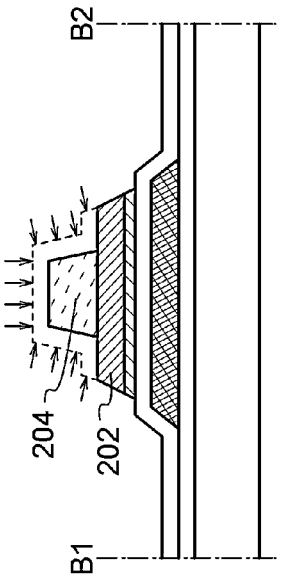
FIG. 5A1
FIG. 5B1
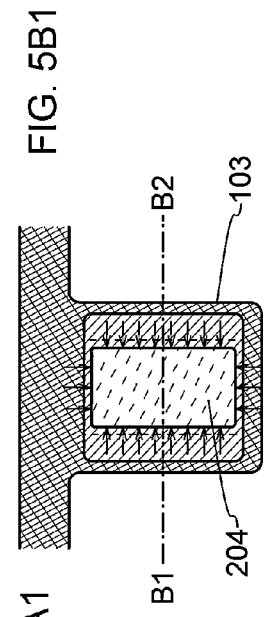
FIG. 5A2
FIG. 5B2
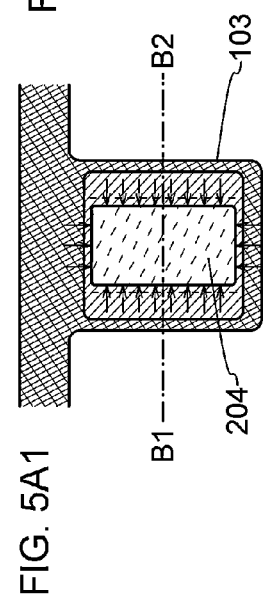
FIG. 5A3
FIG. 5B3
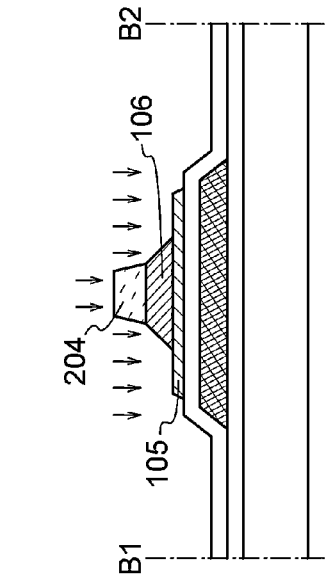
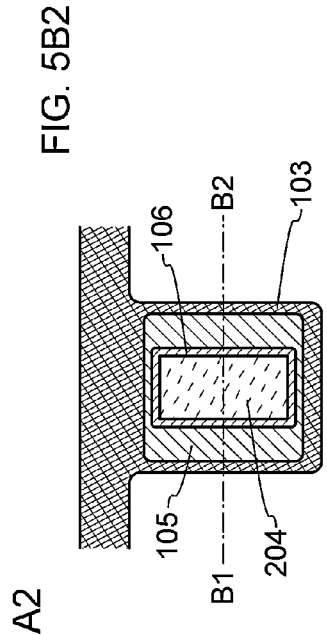
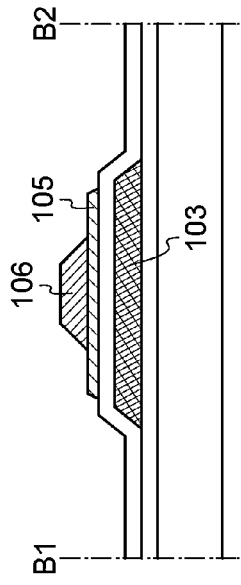

FIG. 6A1
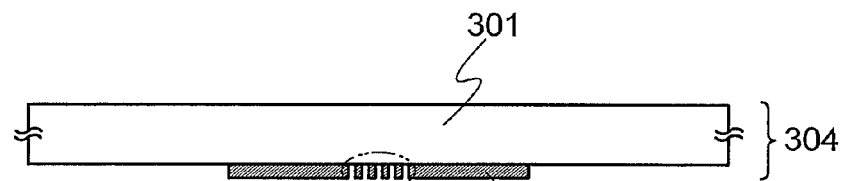
FIG. 6A2
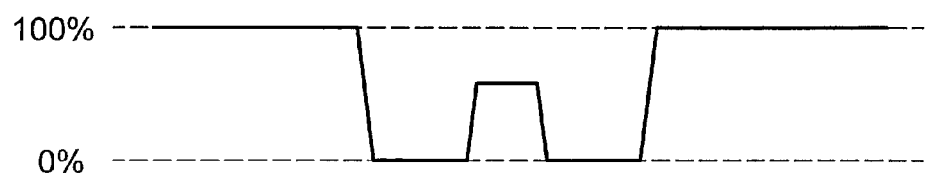
FIG. 6B1
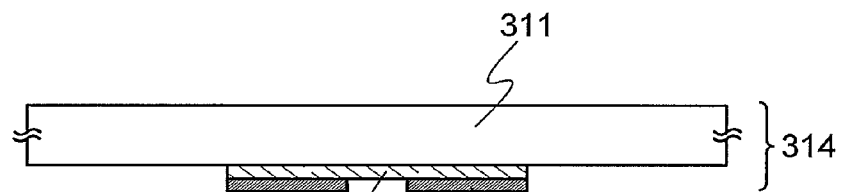
FIG. 6B2
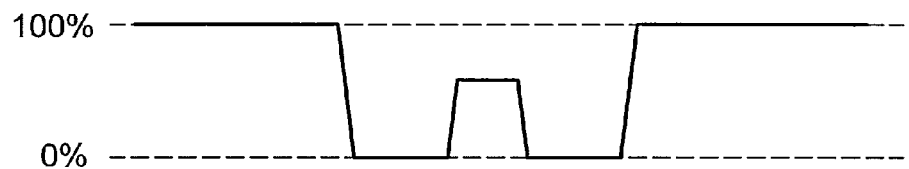

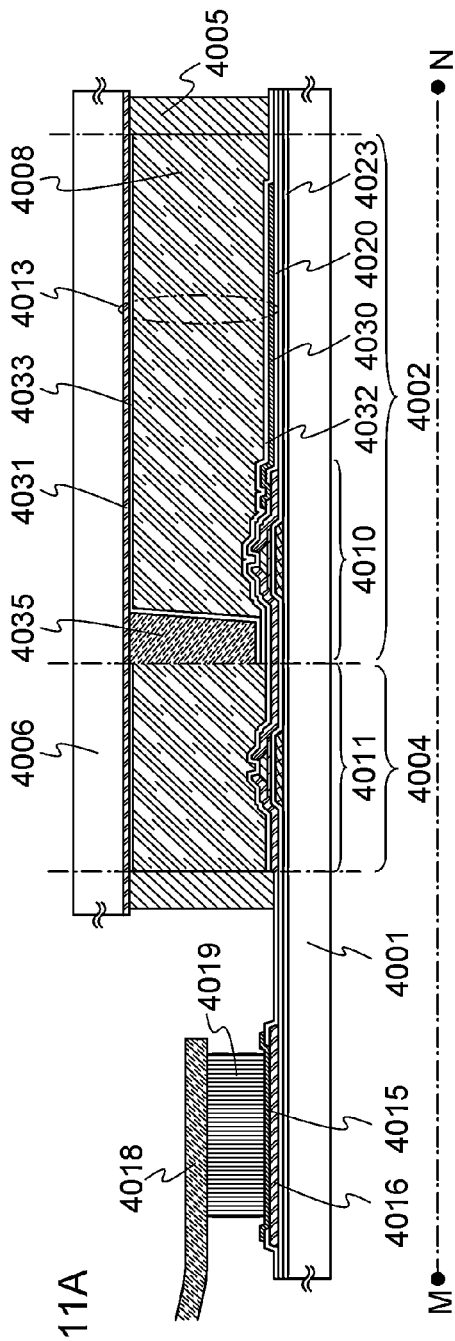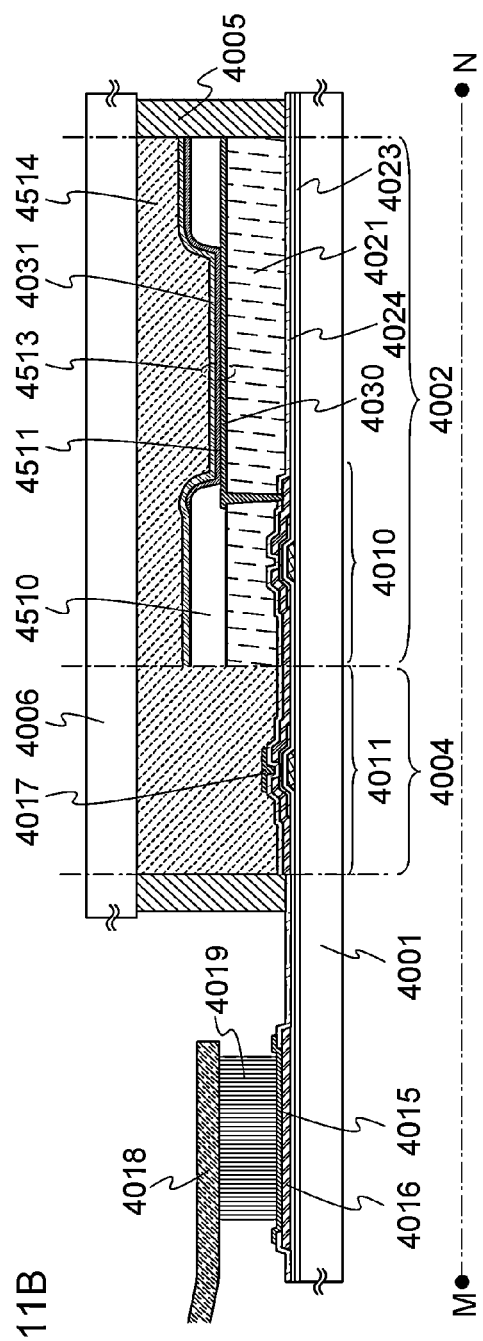

TRANSISTOR WITH OXIDE SEMICONDUCTOR CHANNEL HAVING PROTECTIVE LAYER

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor which includes a semiconductor layer including an amorphous oxide containing indium (In), gallium (Ga), and zinc (Zn) (amorphous IGZO) is disclosed (see Patent Document 1).

REFERENCE

[Patent Document 1] Japanese Published Patent Application No. 2011-181801

SUMMARY OF THE INVENTION

Improvement in reliability is important for commercialization of a semiconductor device which includes a transistor including an oxide semiconductor.

However, a semiconductor device includes a plurality of thin films having complex structures, and is manufactured using a variety of materials, methods, and steps. Therefore, shape defects or degradation of electric characteristics of a semiconductor device which is to be provided might be caused depending on its manufacturing process.

In view of the above problem, it is an object to provide a highly reliable semiconductor device which includes a transistor including an oxide semiconductor.

It is another object to manufacture a highly reliable semiconductor device at a high yield to achieve high productivity.

One embodiment of the present invention is a semiconductor device in which, over an oxide semiconductor layer in which a channel is formed, a protective layer including an oxide insulating material containing at least one of In and Zn or an oxide semiconductor material having a higher insulating property than the oxide semiconductor layer is formed.

Further, the oxide insulating material containing at least one of In and Zn or the oxide semiconductor material having a higher insulating property than the oxide semiconductor layer may be formed under the oxide semiconductor layer in which a channel is formed, or may be formed under and over the oxide semiconductor layer.

One embodiment of the present invention is a semiconductor device in which, over an oxide semiconductor layer in which a channel is formed, a protective layer including an oxide material containing In, an element M (the element M is a Group 3A element, a Group 4A element, or a Group 4B element), and Zn or an oxide material containing In, an element $M_1$ (the element $M_1$ is a Group 3B element), an element $M_2$ (the element $M_2$ is a Group 3A element, a Group 4A element, or a Group 4B element), and Zn is formed.

One embodiment of the present invention is a semiconductor device including a gate electrode, a gate insulating layer, an oxide semiconductor layer, and a protective layer. The oxide semiconductor layer overlaps with the gate electrode with the gate insulating layer interposed therebetween. The protective layer overlaps with the gate insulating layer with the oxide semiconductor layer interposed therebetween. Further, the protective layer includes an oxide material containing In, the element M, and Zn.

As the oxide material containing In, the element M, and Zn, a material represented by a chemical formula $InMZnO_X$ ($X>0$) can be used.

For example, as the element M, titanium (Ti), zirconium (Zr), or hafnium (Hf), which is a Group 4A element; germanium (Ge), which is a Group 4B element; cerium (Ce) or yttrium (Y), which is a Group 3A element; or the like can be used.

The content of the element M is greater than or equal to 0.3 times and smaller than 1.3 times that of In. The content of the element M is greater than or equal to 0.3 times and smaller than 1.3 times that of Zn. The number of In or Zn is relatively reduced as compared to that of the element M, so that an insulating property can be improved.

One embodiment of the present invention is a semiconductor device including a gate electrode, a gate insulating layer, an oxide semiconductor layer, and a protective layer. The oxide semiconductor layer overlaps with the gate electrode with the gate insulating layer interposed therebetween. The protective layer overlaps with the gate insulating layer with the oxide semiconductor layer interposed therebetween. Further, the protective layer includes an oxide material containing In, the element $M_1$, the element $M_2$, and Zn.

As the oxide material containing In, the element $M_1$, the element $M_2$, and Zn, a material represented by a chemical formula $InM_{1X}M_{2(1-X)}ZnO$ ($0<X<1+\alpha$ where $\alpha$ is less than 0.3) can be used. Note that in the element $M_2$, $(1-X)$ is not a negative value.

As the element $M_1$, for example, gallium (Ga), which is a Group 3B element, can be used. As the element $M_2$, for example, titanium (Ti), zirconium (Zr), or hafnium (Hf), which is a Group 4A element; germanium (Ge), which is a Group 4B element; cerium (Ce) or yttrium (Y), which is a Group 3A element; or the like can be used.

The proportion of the element $M_2$ to the element $M_1$ is made higher than or equal to 1 atomic % and lower than 50 atomic %, preferably higher than or equal to 3 atomic % and lower than or equal to 40 atomic %, so that an insulating property can be improved.

The protective layer including an oxide insulating material containing at least one of In and Zn is formed in contact with the oxide semiconductor layer, so that the interface between the protective layer and the oxide semiconductor layer can be kept good and thus, characteristics of a transistor can be improved. Consequently, a highly reliable semiconductor device having stable electric characteristics can be provided.

An oxide semiconductor having a higher insulating property than the oxide semiconductor layer is provided over or under the oxide semiconductor layer, so that variation in threshold voltage due to charge buildup of the insulating layer is suppressed, and characteristic deterioration of or damage to the transistor due to static electricity or the like can be prevented. Consequently, a semiconductor device can be manu-

BRIEF DESCRIPTION OF THE DRAWINGS

FIGS. 4A1 to 4A3 and 4B1 to 4B3 illustrate a method for manufacturing a semiconductor device.

FIGS. 5A1 to 5A3 and 5B1 to 5B3 illustrate a method for manufacturing a semiconductor device.

FIGS. 6A1, 6A2, 6B1, and 6B2 illustrate multi-tone masks.

FIGS. 11A and 11B illustrate structures of a semiconductor device.

DETAILED DESCRIPTION OF THE INVENTION

Hereinafter, embodiments of the invention disclosed in this specification are described with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

A transistor is a kind of semiconductor elements and can achieve amplification of a current or a voltage, switching operation for controlling conduction or non-conduction, or the like. A transistor in this specification includes an insulated-gate field effect transistor (IGFET) and a thin film transistor (TFT).

Functions of a "source" and a "drain" of a transistor are sometimes replaced with each other when the direction of current flowing is changed in circuit operation, for example. Therefore, the terms "source" and "drain" can be used to denote the drain and the source, respectively, in this specification.

In this specification and the like, the terms "over" and "under" do not necessarily mean "directly on" and "directly under", respectively, in the description of a physical relationship between components.

[Embodiment 1]

Figure 1A:
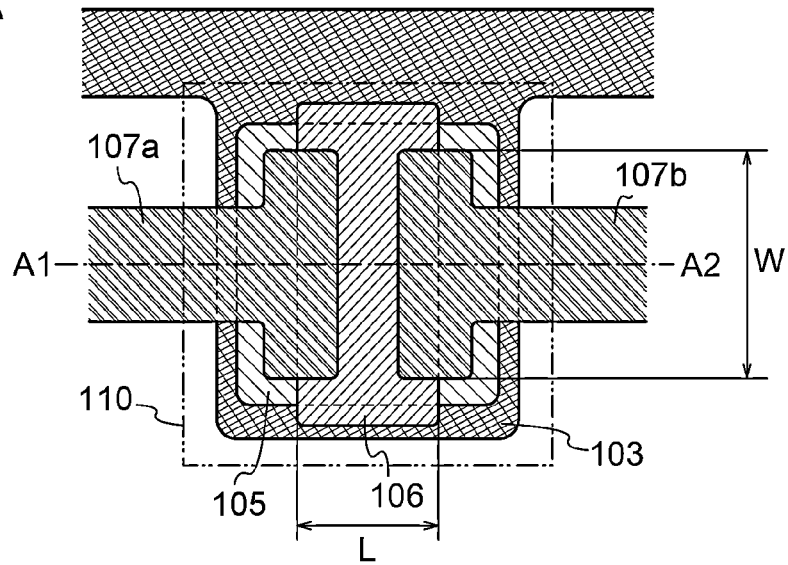
FIGS. 1A to 1C illustrate a structure of a semiconductor device.
Figure 1B:
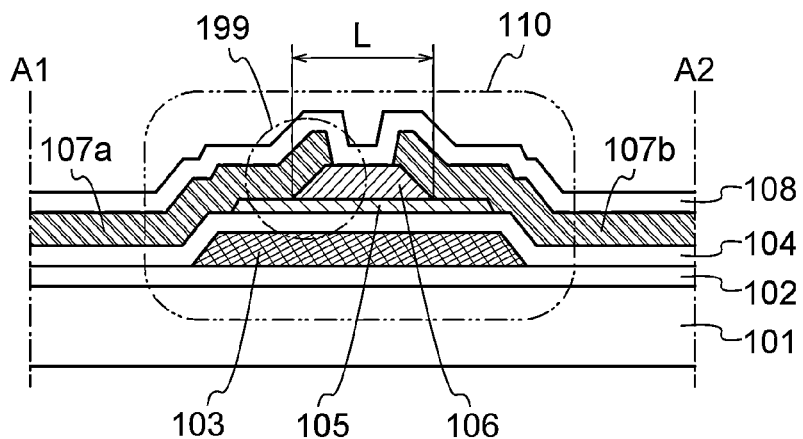
Figure 1C:
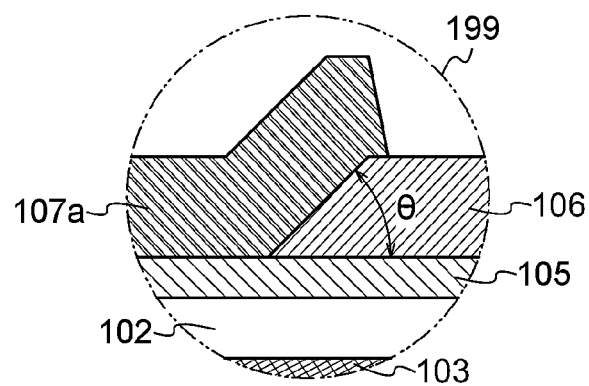

In this embodiment, as one embodiment of a semiconductor device and a method for manufacturing the semiconductor device, a transistor using an oxide semiconductor for its semiconductor layer in which a channel is formed is described with reference to FIGS. 1A to 1C and FIGS. 2A to 2E. FIG. 1A is a top view illustrating a planar structure of a transistor 110 using an oxide semiconductor for its semiconductor layer in which a channel is formed, and FIG. 1B is a cross-sectional view illustrating a cross-sectional structure taken along a chain line A1-A2 in FIG. 1A. FIG. 1C is an enlarged view of a portion 199 in FIG. 1B. Note that the illustration of a substrate 101, an insulating layer 102, a gate insulating layer 104, and an insulating layer 108 is omitted in FIG 1A for easy understanding.

The transistor 110 illustrated in FIGS. 1A to 1C is a kind of bottom-gate transistor having a channel-protected (also referred to as channel-stop) structure and also a kind of inverted staggered transistor.

In FIGS. 1A to 1C, the insulating layer 102 is formed over the substrate 101, and a gate electrode 103 is formed over the insulating layer 102. The gate insulating layer 104 is formed over the gate electrode 103, and an oxide semiconductor layer 105 is formed over the gate insulating layer 104. A protective layer 106 is formed over the oxide semiconductor layer 105, and a source electrode 107a and a drain electrode 107b are formed in contact with part of the protective layer 106 and part of the oxide semiconductor layer 105. Further, the insulating layer 108 may be formed over the protective layer 106. Note that the protective layer 106 extends from end portions of the oxide semiconductor layer 105 in a channel width direction, which is described later.

An oxide semiconductor used for the oxide semiconductor layer 105 contains at least indium (In). In particular, In and zinc (Zn) are preferably contained. In addition, as a stabilizer for reducing variation in electric characteristics of a transistor using the oxide semiconductor layer, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Further, a material which contains an element Q and is represented by a chemical formula $InQO_3(ZnO)_m$ (m>0) may be used as the oxide semiconductor. Note that the element Q denotes one metal element or a plurality of metal elements selected from Zn, Ga, Al, Fe, Mn, and Co. Still alternatively, a material represented by $In_2SnO_5(ZnO)_n$ (n>0) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition of the oxide semiconductor containing indium is not limited to those described above, and a material having an appropriate composition may be used depending on necessary semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, also in the case of using an In—Ga—Zn-based oxide, mobility can be increased by reducing the defect density in a bulk.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$. For example, r may be 0.05. The same applies to other oxides.

The oxide semiconductor used for the oxide semiconductor layer 105 is in a single crystal state, a polycrystalline (also referred to as polycrystal) state, an amorphous state, or the like.

The oxide semiconductor used for the oxide semiconductor layer 105 is preferably a c-axis aligned crystalline oxide semiconductor (CAAC-OS).

The CAAC-OS is not completely single crystal nor completely amorphous. The CAAC-OS is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction perpendicular to a surface where the CAAC-OS is formed or a surface of the CAAC-OS, triangular or hexagonal atomic arrangement which is seen from the direction perpendicular to the a-b plane is formed, and metal atoms are arranged in a layered manner metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, an impurity is added to the CAAC-OS, so that the crystal part in a region to which the impurity is added becomes amorphous in some cases.

Since the c-axes of the crystal portions included in the CAAC-OS are aligned in the direction perpendicular to a surface where the CAAC-OS is formed or a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that the direction of the c-axis of the crystal part is the direction perpendicular to the surface where the CAAC-OS is formed or the surface of the CAAC-OS. The crystal part is formed by film formation or by performing treatment for crystallization such as heat treatment after film formation.

With use of the CAAC-OS in a transistor, variation in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced, and the surface flatness of the oxide semiconductor is improved, so that mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm. Ra can be measured using an atomic force microscope (AFM).

Since the transistor 110 described in this embodiment is a bottom-gate transistor, the gate electrode 103 and the gate insulating layer 104 are positioned under the oxide semiconductor film. Thus, in order to obtain the above-described planar surface, planarization treatment such as CMP treatment may be performed at least on a surface of the gate insulating layer 104 which overlaps with the gate electrode 103 after the gate electrode 103 and the gate insulating layer 104 are formed over the substrate.

The oxide semiconductor layer 105 has a thickness of greater than or equal to 1 nm and smaller than or equal to 30 nm (preferably greater than or equal and smaller than or equal to 5 nm to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor layer 105 may be formed using a sputtering apparatus which performs deposition with surfaces of a plurality of substrates set substantially perpendicular to a surface of a sputtering target.

The protective layer 106 is formed in a position which overlaps with the gate electrode 103 and the oxide semiconductor layer 105. The protective layer 106 functions as a channel protective layer. A channel region of the transistor 110 is formed in the oxide semiconductor layer 105 in a position in which the gate electrode 103 overlaps with the protective layer 106. Thus, the channel length L of the transistor 110 is defined as a length of the protective layer 106 in the direction parallel to the direction in which carriers flow.

The channel width W of the transistor 110 is defined as a shorter length or an average length of the following two lengths in the direction perpendicular to the direction in which carriers flow: the length of a portion in which the oxide semiconductor layer 105, the protective layer 106, and the source electrode 107a are in contact with one another; and the length of a portion in which the oxide semiconductor layer 105, the protective layer 106, and the drain electrode 107b are in contact with one another.

In order to decrease unevenness in the channel region, it is preferable that end portions of the gate electrode 103 be positioned on the outer side than end portions of the protective layer 106 at least in a cross-sectional structure in the channel length direction.

Adjustment of a cross-sectional shape of the protective layer 106, specifically, a cross-sectional shape (e.g., a taper angle or a film thickness) of the end portions thereof, leads to relaxation of electric-field concentration which might occurs near the end portions of the protective layer 106 which overlaps with the source electrode 107a and the drain electrode 107b; thus, the deterioration of electric characteristics of the transistor 110 can be reduced.

Specifically, the end portions of the protective layer 106 are tapered to make a cross-sectional shape of the protective layer 106 trapezoid or triangular. Here, the taper angle θ of each of the end portions of the protective layer 106 is smaller than or equal to 60° C., preferably smaller than or equal to 45° C., more preferably smaller than or equal to 30° C. Setting the taper angle within such a range makes it possible to reduce the electric-field concentration which might occurs near the end portions of the source electrode 107a or the drain electrode 107b when a high gate voltage is applied to the gate electrode 103. Note that the taper angle θ refers to an inclination angle formed by a side surface and a bottom surface of a layer with a tapered shape when the layer is observed from the direction perpendicular to the cross section of the layer (i.e., the plane perpendicular to the surface of the substrate) (see FIG. 1C). A taper angle smaller than 90° is called forward tapered angle and a taper angle of larger than or equal to 90° is called inverse tapered angle. By making the angle of an end of a layer to be a forward tapered angle, a phenomenon in that a layer formed over the end of the layer is separated (disconnection) can be prevented; thus, the coverage with the layer can be improved.

Further, the thickness of the protective layer 106 is smaller than or equal to 0.3 μm, preferably greater than or equal to 5 nm and smaller than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occurs near the end portions of the source electrode 107a or the drain electrode 107b.

An example of a method for manufacturing the transistor 110 is described with reference to FIGS. 2A to 2E.

First, the insulating layer 102 is formed over the substrate 101. There is no particular limitation on a substrate used as the substrate 101; however, it needs to have at least heat resistance to withstand heat treatment performed later. For example, a plastic substrate having heat resistance to withstand the treatment temperature in the manufacturing process can be used as well as a glass substrate, a ceramic substrate, a single-crystal semiconductor substrate or a polycrystalline semiconductor substrate of silicon, silicon carbide, or the like, a compound semiconductor substrate made of silicon germanium or the like, and an SOI substrate. Alternatively, any of these substrates over which a semiconductor element is provided may be used as the substrate 101.

As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further alternatively, a flexible substrate may be used as the substrate 101. In the case where a flexible substrate is used, the transistor 110 may be directly formed over a flexible substrate. Alternatively, the transistor 110 may be formed over a manufacturing substrate, and then, the transistor may be separated from the manufacturing substrate and transferred to a flexible substrate. Note that in order to separate the transistor from the manufacturing substrate and transfer it to the flexible substrate, a separation layer may be provided between the manufacturing substrate and the transistor. In this embodiment, aluminoborosilicate glass is used for the substrate 101.

The insulating layer 102 functions as a base layer, and can prevent or reduce diffusion of an impurity element from the substrate 101. The insulating layer 102 is formed using a signal layer or a stacked layer using one or more of materials selected from aluminum nitride, aluminum oxide, aluminum nitride oxide, aluminum oxynitride, silicon nitride, silicon oxide, silicon nitride oxide, and silicon oxynitride. Note that in this specification, nitride oxide is a substance which includes more nitrogen than oxygen, and an oxynitride is a substance which includes more oxygen than nitrogen. Note that content of each element can be measured by Rutherford backscattering spectrometry (RBS) or the like, for example. The insulating layer 102 can be formed by a sputtering method, a CVD method, a coating method, a printing method, or the like.

By containing a halogen element such as chlorine or fluorine in the base layer, the function of preventing or reducing diffusion of an impurity element from the substrate 101 can be further improved. The concentration of a halogen element contained in the base layer is measured by secondary ion mass spectrometry (SIMS) and its peak is preferably higher than or equal to $1 \times 10^{15}$/cm$^3$ and lower than or equal to $1 \times 10^{20}$/cm$^3$.

In this embodiment, for the insulating layer 102, a 200-nm-thick silicon oxynitride film is formed over the substrate 101 by a plasma CVD method. Further, the temperature in the formation of the insulating layer 102 is preferably high but is lower than or equal to the temperature that the substrate 101 can withstand. For example, the insulating layer 102 is formed while the substrate 101 is heated to a temperature higher than or equal to 350° C. and lower than or equal to 450° C. The temperature in the formation of the insulating layer 102 is preferably constant. For example, the insulating layer 102 is formed while the substrate 101 is heated at 350° C.

After the insulating layer 102 is formed, heat treatment may be performed under reduced pressure, a nitrogen atmosphere, a rare gas atmosphere, or a nitrogen atmosphere with the ultra-dry air. By the heat treatment, the concentration of hydrogen, moisture, hydride, hydroxide, or the like contained in the insulating layer 102 can be reduced. The temperature of the heat treatment is preferably high but is lower than or equal to the temperature that the substrate 101 can withstand. Specifically, the heat treatment is preferably performed at a temperature higher than or equal to the temperature in the formation of the insulating layer 102 and lower than or equal to the strain point of the substrate 101.

Note that the hydrogen concentration in the insulating layer 102 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$.

After the formation of the insulating layer 102, oxygen (including at least any one of oxygen radicals, oxygen atoms, and oxygen ions) may be introduced into the insulating layer 102 so that the insulating layer 102 is in an oxygen-excess state. For the introduction of oxygen, an ion implantation method, an ion doping method, a plasma immersion ion implantation method, plasma treatment performed under an oxygen atmosphere, or the like can be employed.

By introduction of oxygen, the bond of a constituent element in the insulating layer 102 and hydrogen or the bond of the element and a hydroxy group are cleaved, and the hydrogen or the hydroxy group reacts to oxygen, so that water is generated. Thus, heat treatment performed after introduction of oxygen facilitates elimination of the hydrogen or the hydroxyl group as water. Therefore, heat treatment may be performed after oxygen is introduced into the insulating layer 102. After that, oxygen may be introduced again into the insulating layer 102 so that the insulating layer 102 is in an oxygen-excess state.

Next, a conductive layer to be the gate electrode 103 is formed by a sputtering method, a vacuum evaporation method, or a plating method. As a material used for forming the conductive layer to be the gate electrode 103, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, a material containing one or more metal elements selected from manganese (Mn), magnesium (Mg), zirconium (Zr), and beryllium (Be) may be used. Alternatively, a semiconductor typified by polycrystalline silicon including an impurity element such as phosphorus, or silicide such as nickel silicide may be used.

The conductive layer to be the gate electrode 103 may have a single-layer structure or a stacked structure of two or more layers. Examples thereof are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over Cu—Mg—Al alloy, and a three-layer structure in which titanium nitride, copper, and tungsten are stacked in this order.

For the conductive layer to be the gate electrode 103, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked structure of the above light-transmitting conductive material and a material containing the above metal element can be employed.

For the conductive layer to be the gate electrode 103, a metal oxide containing nitrogen, specifically, an In—Ga—Zn-based oxide film containing nitrogen, an In—Sn-based oxide film containing nitrogen, an In—Ga-based oxide film containing nitrogen, an In—Zn-based oxide film containing nitrogen, a Sn-based oxide film containing nitrogen, an In-based oxide film containing nitrogen, or a metal nitride (InN, SnN, or the like) film can be used.

These materials each have a work function higher than or equal to 5 electron volts (eV); thus, when these films are used for the gate electrode, the threshold voltage of the electric characteristics of the transistor can be positive. Accordingly, a so-called normally-off n-type transistor can be achieved.

In this embodiment, a 100-nm-thick tungsten film is formed by a sputtering method for the conductive layer to be the gate electrode 103.

Figure 2A:
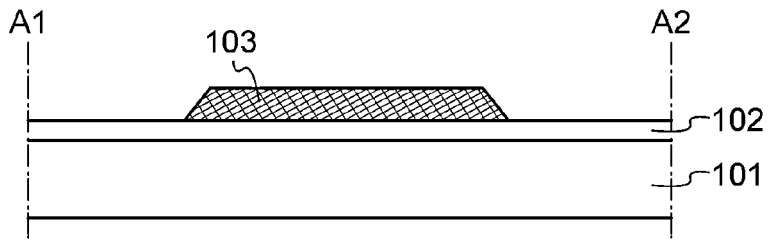
FIGS. 2A to 2E illustrate a method for manufacturing a semiconductor device.

Next, part of the conductive layer to be the gate electrode 103 is selectively etched to form the gate electrode 103 (and a wiring which is formed in the same layer as the gate electrode 103) (see FIG. 2A). In the case of etching part of the conductive layer selectively, a resist mask is formed over the conductive layer, and an unnecessary portion in the conductive layer may be removed by a dry etching method or a wet etching method. Further, that etching may be conducted by a combination of a dry etching method and a wet etching method. The resist mask formed over the conductive layer can be formed by a photolithography method, a printing method, an inkjet method, or the like. Formation of the resist mask by an inkjet method needs no photomask; thus, manufacturing cost can be reduced.

When the conductive layer is etched by a dry etching method, a gas containing a halogen element can be used as the etching gas. As an example of a gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be given. Further, an inert gas may be added to an etching gas. As the dry etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

Note that a process in which an appropriately-shaped resist mask is formed over a conductive layer or an insulating layer by a photolithography method is referred to as a photolithography process: in general, after the formation of the resist mask, an etching step and a separation step of the resist mask are performed in many cases. Thus, unless otherwise specified, a photolithography process in this specification includes a step of forming a resist mask, a step of etching a conductive layer or an insulating layer, and a step of removing the resist mask.

Next, the gate insulating layer 104 is formed over the gate electrode 103.

Note that planarization treatment may be performed on a surface of the gate electrode 103 in order to improve coverage with the gate insulating layer 104. It is preferable that the planarity of the surface of the gate electrode 103 is good particularly when a thin insulating layer is used for the gate insulating layer 104.

The gate insulating layer 104 can be formed by a sputtering method, an MBE method, a CVD method, a pulsed laser deposition method, an ALD method, or the like as appropriate. A high-density plasma CVD method using a microwave (e.g., microwaves with a frequency of 2.45 GHz) or the like can also be applied. The gate insulating layer 104 may be formed using a sputtering apparatus which performs film formation with surfaces of a plurality of substrates set substantially perpendicular to a surface of a sputtering target.

The gate insulating layer 104 can be formed using a single layer or a stacked layer using one or more of materials selected from aluminum nitride, aluminum oxide, aluminum nitride oxide, aluminum oxynitride, gallium oxide, silicon nitride, silicon oxide, silicon nitride oxide, and silicon oxynitride.

Further, the capacitance between the gate electrode 103 and the channel formation region of the oxide semiconductor layer 105 is preferably large; however, a reduction in thickness of the gate insulating layer 104 in order to increase capacitance leads to an increase in the leakage current generated between the gate electrode 103 and the oxide semiconductor layer 105.

The use of a high-k material such as hafnium silicate (Hf$Si_xO_y$), hafnium silicate to which nitrogen is added (Hf$Si_xO_yN_z$), hafnium aluminate to which nitrogen is added (Hf$Al_xO_yN_z$), hafnium oxide, or yttrium oxide for the gate insulating layer 104 enables the capacitance between the gate electrode 103 and the oxide semiconductor layer 105 to be sufficiently ensured even when the thickness of the gate insulating layer 104 is increased.

For example, a capacitance value as high as a capacitance value obtained in the case of forming the insulating layer 104 using silicon oxide can be obtained even in the case of forming the insulating layer 104 thick; thus, the leakage current generated between the gate electrode 103 and the oxide semiconductor layer 105 can be reduced. Further, a leakage current generated between the wiring formed using the same layer as the gate electrode 103 and another wiring which overlaps with the wiring can be reduced. Note that a stacked structure may be used in which a high-k material and one or more of silicon oxide, silicon oxynitride, silicon nitride, silicon nitride oxide, aluminum oxide, aluminum oxynitride, and gallium oxide are stacked. The thickness of the gate insulating layer 104 may be greater than or equal to 10 nm and less than or equal to 300 nm, preferably greater than or equal to 50 nm and less than or equal to 200 nm. For example, the gate insulating layer 104 may have a stacked structure of a silicon nitride film with a thickness of greater than or equal to 10 nm and less than or equal to 50 nm and a silicon oxynitride film with a thickness of greater than or equal to 100 nm and less than or equal to 300 nm.

Further, the temperature in the formation of the gate insulating layer 104 is preferably high but is lower than or equal to the temperature that the substrate 101 and the gate electrode 103 can withstand. For example, for the gate insulating layer 104, a 200-nm-thick silicon oxynitride film is formed by a high-density plasma CVD method while the substrate 101 is heated to a temperature higher than or equal to 350° C. and lower than or equal to 450° C. The temperature in the formation of the gate insulating layer 104 is preferably constant. For example, the gate insulating layer 104 is formed while the substrate 101 is heated at 350° C.

Further, after the gate insulating layer 104 is formed, heat treatment may be performed under reduced pressure, a nitrogen atmosphere, a rare gas atmosphere, or a nitrogen atmosphere with the ultra-dry air. By the heat treatment, the concentration of hydrogen, moisture, hydride, hydroxide, or the like contained in the gate insulating layer 104 can be reduced. The temperature of the heat treatment is preferably high but is lower than or equal to the temperature that the substrate 101 can withstand. Specifically, the heat treatment is preferably performed at a temperature higher than or equal to the temperature in the formation of the gate insulating layer 104 and lower than or equal to the strain point of the substrate 101.

Note that the hydrogen concentration in the gate insulating layer 104 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$.

Further, the gate insulating layer 104 preferably includes oxygen in a portion which is in contact with the oxide semiconductor layer 105. In particular, the gate insulating layer 104 preferably contains a large amount of oxygen which exceeds at least the stoichiometry in (a bulk of) the layer. For example, in the case where silicon oxide is used as the gate insulating layer 104, the composition formula is $SiO_{2+\alpha}$ ($\alpha>0$).

After the formation of the gate insulating layer 104, oxygen (including at least any one of oxygen radicals, oxygen atoms, and oxygen ions) may be introduced into the gate insulating layer 104 so that the gate insulating layer 104 is in an oxygen-excess state. For the introduction of oxygen, an ion implantation method, an ion doping method, a plasma immersion ion implantation method, plasma treatment performed under an oxygen atmosphere, or the like can be employed.

By introduction of oxygen, a bond between hydrogen and a constituent element in the gate insulating layer 104 or a bond between the constituent element and a hydroxyl group is cleaved, and the hydrogen or the hydroxyl group reacts with the oxygen, so that water is produced. Accordingly, heat treatment performed after introduction of oxygen facilitates elimination of hydrogen or hydroxyl group which is an impurity as water. Therefore, heat treatment may be performed after introduction of oxygen into the gate insulating layer 104. After that, oxygen may be introduced again into the gate insulating layer 104 so that the gate insulating layer 104 is in an oxygen-excess state.

The gate insulating layer 104 including a large amount of (excessive) oxygen, which serves as an oxygen supply source, is provided so as to be in contact with the oxide semiconductor layer 105, so that oxygen can be supplied from the gate insulating layer 104 to the oxide semiconductor layer 105. Heat treatment may be performed in the state where the oxide semiconductor layer 105 and the gate insulating layer 104 are at least partly in contact with each other to supply oxygen to the oxide semiconductor layer 105.

By supply of oxygen to the oxide semiconductor layer 105, oxygen vacancies in the oxide semiconductor layer 105 can be reduced. Further, the gate insulating layer 104 is preferably formed in consideration of the size of a transistor to be formed and the step coverage with the gate insulating layer 104.

Next, an oxide semiconductor layer to be the oxide semiconductor layer 105 is formed over the gate insulating layer 104 by a sputtering method.

Note that planarization treatment may be performed on a region of the gate insulating layer 104 with which the oxide semiconductor layer 105 is formed in contact before the formation of the oxide semiconductor layer. As the planarization treatment, polishing treatment (e.g., chemical mechanical polishing (CMP) method), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source under an argon atmosphere and plasma is generated near the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating layer 104.

Further, as the planarization treatment, polishing treatment, dry etching treatment, or plasma treatment may be performed plural times, or these treatments may be performed in combination. In the case where the treatments are performed in combination, there is no particular limitation on the order of steps and the order can be set as appropriate depending on the roughness of the surface of the gate insulating layer 104.

Note that a rare gas (a typical example thereof is argon) atmosphere, an oxygen atmosphere, or a mixed gas of a rare gas and oxygen is used as appropriate as a sputtering gas used for forming the oxide semiconductor layer. Further, it is preferable that a high-purity gas from which impurities such as hydrogen, water, a hydroxyl group, and hydride are removed be used as the sputtering gas.

Note that the oxide semiconductor layer to be the oxide semiconductor layer 105 is preferably deposited under a condition such that a lot of oxygen is contained (for example, by a sputtering method in an atmosphere where the proportion of oxygen is 100%) so as to be a film containing a lot of oxygen (preferably containing a region which contains excessive oxygen as compared to the stoichiometric composition of the oxide semiconductor in a crystalline state).

As a target for forming the oxide semiconductor by a sputtering method, a target that contains a metal oxide containing In, Ga, and Zn at a composition of $In_2O_3:Ga_2O_3:ZnO =1:1:1$ [molar ratio] can be used, for example. Alternatively, a target having a composition where $In_2O_3:Ga_2O_3:ZnO=1:1:2$ [molar ratio], a target having a composition where $In_2O_3:Ga_2O_3:ZnO=1:1:4$ [molar ratio], or a target having a composition where $In_2O_3:Ga_2O_3:ZnO=2:1:8$ [molar ratio] can be used.

Furthermore, the relative density of a metal oxide target is greater than or equal to 90% and less than or equal to 100%, preferably greater than or equal to 95% and less than or equal to 99.9%. With the use of a metal oxide target having a high relative density, a dense oxide semiconductor film can be formed.

When the oxide semiconductor is formed, the substrate is held in a film formation chamber kept under reduced pressure, and the substrate temperature is set to a temperature higher than or equal to 100° C. and lower than or equal to 600° C., preferably higher than or equal to 300° C. and lower than or equal to 500° C.

By heating the substrate during the film formation, the concentration of impurities such as hydrogen, moisture, hydride, or hydroxide in the oxide semiconductor can be reduced. In addition, damage by sputtering can be reduced. Then, a sputtering gas from which hydrogen and moisture are removed is introduced into the deposition chamber while moisture remaining therein is removed, and the oxide semiconductor is formed with the use of the above target.

The concentration of an alkali metal such as Na or Li in the oxide semiconductor is preferably lower than or equal to $1\times10^{18}$ atoms/cm³, more preferably lower than or equal to $2\times10^{16}$ atoms/cm³.

As one example of the film formation condition, the distance between the substrate and the target is 100 mm, the pressure is 0.6 Pa, the power of the direct-current (DC) power source is 0.5 kW, and the atmosphere is an oxygen atmosphere (the proportion of the oxygen flow is 100%). Note that a pulsed direct-current power source is preferably used, in which case powder substances (also referred to as particles or dusts) that are generated in film formation can be reduced and the film thickness can be uniform.

Note that even when the sputtering apparatus is used, the oxide semiconductor contains more than a little nitrogen in some cases. For example, the oxide semiconductor contains nitrogen with a concentration of lower than $5\times10^{18}$ atoms/cm³ measured by SIMS in some cases.

The sputtering apparatus used for the formation of the oxide semiconductor is described in detail below.

The leakage rate of a treatment chamber used for forming an oxide semiconductor is preferably lower than or equal to $1\times10^{-10}$ Pa·m³/second. Thus, entry of an impurity into a film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m³/second.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the treatment chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, surface unevenness of the member is decreased by polishing or the like to reduce the surface area, so that the released gas can be reduced. Alternatively, the above-mentioned member of the deposition apparatus may be covered with iron fluoride, aluminum oxide, chromium oxide, or the like which is in the passive state.

Furthermore, it is preferable to provide a gas refiner for a sputtering gas just in front of the treatment chamber into which a sputtering gas is introduced. At this time, the length of a pipe between the gas refiner and the treatment chamber is less than or equal to 5 m, preferably less than or equal to 1 m. When the length of the pipe is less than or equal to 5 m or less than or equal to 1 m, an influence of the released gas from the pipe can be reduced accordingly.

Evacuation of the treatment chamber is preferably performed with a roughing vacuum pump, such as a dry pump, and a high vacuum pump, such as a sputter ion pump, a turbo molecular pump, or a cryopump, in appropriate combination. In order to remove moisture remaining in the treatment chamber, an entrapment vacuum pump such as a cryopump, an ion pump, or a titanium sublimation pump is preferably used. The turbo molecular pump has an outstanding capability in evacuating a large-sized molecule, whereas it has a low capability in evacuating hydrogen or water. Further, combination with a cryopump having a high capability in evacuating water or a sputter ion pump having a high capability in evacuating hydrogen is effective. The evacuation unit may be a turbo molecular pump provided with a cold trap. In the treatment chamber which is evacuated with an entrapment vacuum pump such as a cryopump, a hydrogen atom, a compound containing a hydrogen atom such as water ($H_2O$) (more preferably, also a compound containing a carbon atom), and the like are removed, whereby the impurity concentration in the oxide semiconductor formed in the treatment chamber can be reduced.

An adsorbate present at the inner wall of the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, removing the adsorbate while an inert gas is introduced makes it possible to further increase the rate of desorption of water or the like, which is difficult to desorb only by evacuation.

In a sputtering method, an RF power supply device, an AC power supply device, a DC power supply device, or the like can be used as a power supply device for generating plasma as appropriate. Note that a pulsed DC power source is preferably used because powder substances (also referred to as particles or dust) that are generated in deposition can be reduced and the film thickness can be uniform.

In this embodiment, for the oxide semiconductor layer to be the oxide semiconductor layer 105, a 35-nm-thick In—Ga—Zn-based oxide (IGZO) film is formed by a sputtering method using a sputtering apparatus including an AC power supply device. Further, as the target, an In—Ga—Zn-based oxide target in an atomic ratio of In:Ga:Zn=1:1:1 (=1/3:1/3:1/3) is used. The deposition conditions are as follows: the atmosphere is oxygen and argon (the flow rate of oxygen is 50%), the pressure is 0.6 Pa, the electric power is 5 kW, and the substrate temperature is 170° C. The deposition rate under the deposition conditions is 16 nm/min.

The concentrations of alkali metals such as sodium (Na), lithium (Li), and potassium (K) in the oxide semiconductor layer are as follows. The concentration of Na is lower than or equal to $5 \times 10^{16}$ cm$^{-3}$, preferably lower than or equal to $1 \times 10^{16}$ cm$^{-3}$, more preferably lower than or equal to $1 \times 10^{15}$ cm$^{-3}$. The concentration of Li is lower than or equal to $5 \times 10^{15}$ cm$^{-3}$, preferably lower than or equal to $1 \times 10^{15}$ cm$^{-3}$. The concentration of K is lower than or equal to $5 \times 10^{15}$ cm$^{-3}$, preferably lower than or equal to $1 \times 10^{15}$ cm$^{-3}$.

Note that it has been pointed out that, because an oxide semiconductor is insensitive to impurities and thus there is no problem when a considerable amount of metal impurities is contained in the oxide semiconductor, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). However, such consideration is not appropriate. An alkali metal is not a constituent element in an oxide semiconductor, and therefore, is an impurity. Also, an alkaline earth metal is an impurity in the case where the alkaline earth metal is not a constituent element in an oxide semiconductor. When an insulating layer in contact with the oxide semiconductor layer is an oxide, an alkali metal, in particular, Na diffuses into the insulating layer and Na becomes Na$^+$. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of transistor characteristics and variation in characteristics due to an impurity remarkably appear when the hydrogen concentration in the oxide semiconductor layer is very low. Therefore, the concentration of an alkali metal in the oxide semiconductor is strongly required to set at the above value in the case where the concentration of hydrogen in the oxide semiconductor is lower than or equal to $5 \times 10^{19}$ cm$^{-3}$, particularly lower than or equal to $5 \times 10^{18}$ cm$^{-3}$.

Further, before the oxide semiconductor layer to be the oxide semiconductor layer 105 is formed, heat treatment may be performed under reduced pressure, a nitrogen atmosphere, a rare gas atmosphere, or a nitrogen atmosphere with the ultra-dry air. For example, heat treatment may be performed at a temperature higher than or equal to 350° C. and lower than or equal to 450° C. under a nitrogen atmosphere. For example, heat treatment is performed at 350° C. for one hour. With the heat treatment, an impurity, such as hydrogen, moisture, or hydrocarbon, attached to a surface of the gate insulating layer 104 can be reduced. It is preferable that the oxide semiconductor layer be formed successively without exposing the substrate 101 to the air.

Steps from the formation of the gate insulating layer 104 to the formation of the oxide semiconductor layer are preferably performed successively without exposure to the air. Successive formation of the gate insulating layer 104 and the oxide semiconductor layer without exposure to the air enables adsorption of an impurity, such as hydrogen, moisture, or hydrocarbonon on the surface of the gate insulating layer 104 to be prevented. That is, the interface between the gate insulating layer 104 and the oxide semiconductor layer can be kept clean and thus, reliability of the semiconductor device can be improved.

Figure 2B:
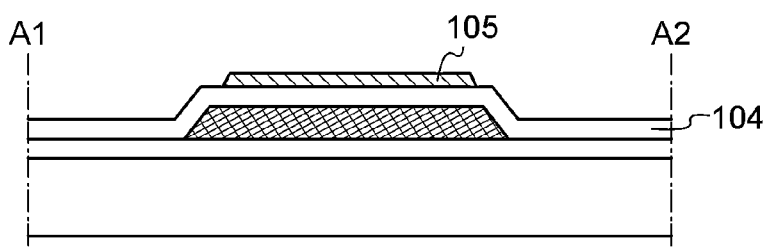

Next, by a photolithography process, the oxide semiconductor layer is processed into the island-shaped oxide semiconductor layer 105 (see FIG. 2B). A resist mask for forming the island-shaped oxide semiconductor layer 105 may be formed by an inkjet method. Formation of the resist mask by an inkjet method needs no photomask; thus, manufacturing cost can be reduced.

Note that the etching of the oxide semiconductor layer may be a dry etching method, a wet etching method, or both dry etching and wet etching. When the oxide semiconductor layer is etched by a wet etching method, a solution obtained by mixing phosphoric acid, acetic acid, and nitric acid, a solution containing oxalic acid, or the like can be used as the etchant. ITO-07N (produced by KANTO CHEMICAL CO., INC.) may also be used. When the oxide semiconductor layer is etched by a dry etching method, for example, a reactive ion etching (RIE) method, or a dry etching method using a high-density plasma source such as an electron cyclotron resonance (ECR) source or an inductively coupled plasma (ICP) source can be used. As a dry etching method by which uniform electric discharge can be performed over a large area, there is a dry etching method using an enhanced capacitively coupled plasma (ECCP) mode. This dry etching method can be applied even when a substrate of the tenth generation, the size of which exceeds 3 m, is used as the substrate, for example.

Further, heat treatment may be performed on the oxide semiconductor layer 105 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, a rare gas atmosphere, or the like.

In this embodiment, after the substrate is put in an electric furnace which is a kind of heat treatment apparatus, the oxide semiconductor layer 105 is subjected to heat treatment at a temperature higher than or equal to 350° C. and lower than or equal to 450° C. for one hour under a nitrogen atmosphere, and is subjected to heat treatment at a temperature higher than or equal to 350° C. and lower than or equal to 450° C. for one hour in a mixed atmosphere of nitrogen and oxygen. For example, heat treatment is performed at 350° C. for one hour.

Note that a heat treatment apparatus used is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

During the heat treatment, it is preferable that an atmosphere of an inert gas such as nitrogen or a rare gas such as helium, neon, or argon do not contain water, hydrogen, and the like. It is preferable that the purity of nitrogen or the rare gas such as helium, neon, or argon which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

In addition, after the oxide semiconductor layer 105 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, or more preferably less than or equal to 10 ppb, in the case where measurement is performed with use of a dew point meter of a cavity ring down laser spectroscopy (CRDS) system) may be introduced into the same furnace. It is preferable that water, hydrogen, or the like not be contained in the oxygen gas or the dinitrogen monoxide gas. Alternatively, the purity of the oxygen gas or the dinitrogen monoxide gas which is introduced into the heat treatment apparatus is preferably higher than or equal to 6N, more preferably higher than or equal to 7N (i.e., the impurity concentration in the oxygen gas or the dinitrogen monoxide gas is preferably lower than or equal to 1 ppm, more preferably lower than or equal to 0.1 ppm). By the effect of the oxygen gas or the dinitrogen monoxide gas, oxygen which is a main component of the oxide semiconductor and which has been reduced at the same time as the step for removing impurities by dehydration or dehydrogenation is supplied, so that the oxide semiconductor layer 105 can be a highly-purified i-type (intrinsic) oxide semiconductor layer.

The dehydration or dehydrogenation treatment may be accompanied by elimination of oxygen which is a main constituent material of an oxide semiconductor to lead to a reduction in oxygen. An oxygen vacancy exists in a portion where oxygen is eliminated in an oxide semiconductor film, and a donor level which leads to variation in electric characteristics of the transistor is formed owing to the oxygen vacancy.

Therefore, oxygen (including at least any one of oxygen radicals, oxygen atoms, and oxygen ions) may be introduced into the oxide semiconductor layer 105 after being subjected to dehydration or dehydrogenation to supply oxygen to the oxide semiconductor layer.

For the introduction of oxygen, an ion implantation method, an ion doping method, a plasma immersion ion implantation method, plasma treatment performed under an oxygen atmosphere, or the like can be employed.

Further, by the introduction of oxygen, a bond between the constituent element in the oxide semiconductor and hydrogen or a bond between the constituent element and a hydroxyl group is cleaved, and the hydrogen or the hydroxyl group is reacted with oxygen to produce water; this leads to easy elimination of the hydrogen or the hydroxyl group that is an impurity as water by the heat treatment performed later. Thus, heat treatment may be performed after oxygen is introduced into the oxide semiconductor layer 105, and after that, oxygen may be introduced again into the oxide semiconductor layer 105.

Oxygen is introduced into the dehydrated or dehydrogenated oxide semiconductor layer 105 to supply oxygen to the layer, so that the oxide semiconductor layer 105 can be a highly-purified i-type (intrinsic) semiconductor. Variation in electric characteristics of the transistor including the highly-purified i-type (intrinsic) oxide semiconductor layer 105 is suppressed, and the transistor is electrically stable.

Note that the heat treatment for dehydration or dehydrogenation and introduction of oxygen may be performed after the oxide semiconductor layer is formed before the oxide semiconductor layer is processed into the island-shaped oxide semiconductor layer 105 and/or after the island-shaped oxide semiconductor layer 105 is formed. The heat treatment for dehydration or dehydrogenation and the introduction of oxygen may be performed plural times.

Note that the hydrogen concentration in the oxide semiconductor layer 105 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$.

Figure 2C:
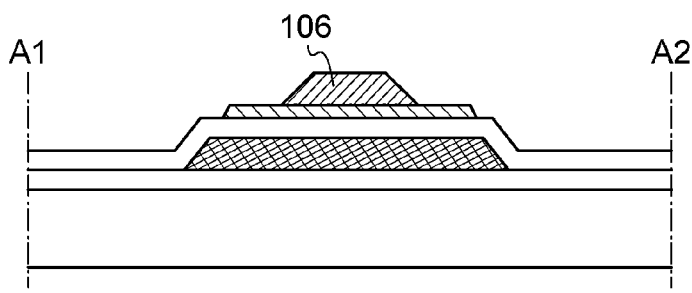

Next, a protective layer is formed over the oxide semiconductor layer 105, and is processed by a photolithography process in order to form the island-shaped protective layer 106 (see FIG. 2C). As a material used for the protective layer 106, an oxide insulating material which contains at least one of In and Zn or an oxide semiconductor material having a higher insulating property than the oxide semiconductor layer 105 is used.

For example, the material which contains the element M and is represented by the chemical formula InMZnO$_X$ (X>0) can be used for the protective layer 106. At this time, an element by which the protective layer 106 is provided with a higher insulating property than the oxide semiconductor layer 105 is used as the element M. For example, as the element M, a metal element to produce a quadrivalent ion, such as titanium (Ti), zirconium (Zr), or hafnium (Hf), which is a Group 4A element; cerium, which is a Group 3A element; or germanium (Ge), which is a Group 4B element, can be used.

A quadrivalent metal element has one more bonds than a trivalent metal element (e.g., Ga), and has stronger bonding strength to oxygen than the trivalent metal element; thus, the material represented by the chemical formula $InMZnO_X$ (X>0) can have an improved insulating property. For example, InZrZnO has a greater energy gap than InGaZnO which has an energy gap of approximately 3.2 eV, and thus have a higher insulating property than InGaZnO.

Note that a Group 3A element can also be used as long as it is an element for improving an insulating property. As an example of such an element, yttrium (Y) can be given. Yttrium has lower electronegativity than Ga, and can bond more strongly to oxygen in the oxide semiconductor.

Note that in this specification, the term "energy gap" has the same meaning as a "band gap" or a "forbidden band". The value obtained by measuring a film consisting of a material with an ellipsometer is used as the value of the band gap.

In the material represented by the chemical formula $InMZnO_X$ (X>0), the content of the element M is greater than or equal to 0.3 times and smaller than 1.3 times that of In. Further, in the material represented by the chemical formula $InMZnO_X$ (X>0), the content of the element M is greater than or equal to 0.3 times and smaller than 1.3 times that of Zn. As the number of In or Zn is relatively reduced as compared to that of the element M, an insulating property can be improved.

Specifically, when an oxide semiconductor material containing the element M is formed by a sputtering method, an oxide target containing In, M, and Zn in an atomic ratio of 1:1:1, 3:1:3, 3:2:4, 2:1:3, 4:5:4, or 4:2:3 is used.

Further, an oxide material which contains the element $M_1$ and the element $M_2$ and is represented by the chemical formula $InM_{1X}M_{2(1-X)}ZnO$ (0<X<1+α where α is less than 0.3) can be used for the protective layer 106. Specifically, in the material, the element $M_1$ is a metal element to produce a trivalent ion, and one or more of the metal elements are substituted with one or more of metal elements to produce a quadrivalent ion. Since a quadrivalent metal element has one more bonds than a trivalent metal element, the substitution with the element $M_2$ makes bonding strength to oxygen stronger and suppresses generation of oxygen vacancies. That is, by increasing the proportion of the element $M_2$ to the element $M_1$, the insulating property of the material can be improved.

Specifically, in the oxide material, the element $M_2$ is added in the proportion of the element $M_2$ to the element $M_1$ of higher than or equal to 1 atomic % and lower than 50 atomic %, preferably higher than or equal to 3 atomic % and lower than 40 atomic % in order to suppress generation of oxygen vacancies and improve an insulating property. Note that X may be or may not be a natural number. Note that in the element $M_2$, (1−X) is not a negative value.

As the element $M_1$, gallium (Ga), which is a Group 3B element, can be used for example. As the element $M_2$, titanium (Ti), zirconium (Zr), or hafnium (Hf), which is a Group 4A element; cerium, which is a Group 3A element; germanium (Ge), which is a Group 4B element; or the like can be used. Note that the above material is non-single-crystal.

A trivalent metal element can also be used as the element $M_2$ as long as it is an element which enables an insulating property to be improved. As an example of such an element, yttrium (Y), which is a Group 3A element, can be given. Since yttrium has lower electronegativity than Ga, yttrium can strongly bond to oxygen in the oxide semiconductor, which improves the insulating property.

Further, in the above material, the amount of a heavy-metal impurity other than the constituent elements is little, and the purity of the above material is greater than or equal to 3N, preferably greater than or equal to 4N.

In this embodiment, the material represented by the chemical formula $InM_{1X}M_{2(1-X)}ZnO$ (0<X<1+α where α is less than 0.3 and (1−X)>0) is used for the protective layer 106. Specifically, an InZrGaZnO film is formed using a target containing In, Zr, Ga, and Zn in an atomic ratio of 3:0.05:0.95:2 (where X is 0.05) by a sputtering method.

The material represented by the chemical formula $InMZnO_X$ (X>0) or the material represented by the chemical formula $InM_{1X}M_{2(1-X)}ZnO$ (0<X<1+α where α is less than 0.3 and (1−X)>0) enables the condition of the interface with the oxide semiconductor layer 105 to be good, which leads to good characteristics of the transistor. Further, such an oxide semiconductor having a higher insulating property than the oxide semiconductor layer 105 is used for the protective layer 106, so that a parasitic channel is not generated and thus, variation in threshold voltage due to charge buildup of the insulating layer is suppressed. As the oxide semiconductor having a higher insulating property than the oxide semiconductor layer 105, any material represented by the above chemical formula can be used.

After the formation of the protective layer 106, oxygen (including at least any one of oxygen radicals, oxygen atoms, and oxygen ions) may be introduced into the protective layer 106 to supply oxygen to the protective layer 106. Oxygen may be directly introduced into the protective layer 106 or introduced into the protective layer 106 through another film such as the insulating layer 108. When oxygen is introduced into the protective layer 106 through another film, an ion implantation method, an ion doping method, a plasma immersion ion implantation method, or the like may be used. On the other hand, when oxygen is directly introduced into the protective layer 106, in addition to the above methods, plasma treatment performed under an oxygen atmosphere, or the like can alternatively be employed.

By introducing oxygen, a bond between a constituent element in the protective layer 106 and hydrogen or a bond between the constituent element and a hydroxyl group is cleaved, and the hydrogen or the hydroxyl group is reacted with oxygen to produce water; this leads to easy elimination of hydrogen or a hydroxyl group that is an impurity as water by heat treatment after the introduction of oxygen. That is, the impurity concentration in the protective layer 106 can be further reduced. Thus, heat treatment may be performed after oxygen is introduced into the protective layer 106. After that, oxygen may be introduced again into the protective layer 106 so that the protective layer 106 is in an oxygen-excess state.

Note that the hydrogen concentration in the protective layer 106 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$.

Further, before the formation of the protective layer 106, moisture or an organic substance which is attached to the surface of the oxide semiconductor layer 105 is preferably removed by oxygen plasma treatment, dinitrogen monoxide plasma treatment, or the like. The protective layer 106 is preferably formed successively without exposure to the air after the oxygen plasma treatment, the dinitrogen monoxide plasma treatment, or the like is performed.

Further, the protective layer 106 can be etched by a wet etching method or a dry etching method.

After the island-shaped protective layer 106 is formed, heat treatment may be performed under a nitrogen atmosphere, a rare gas atmosphere, an oxygen atmosphere, a mixed gas atmosphere of nitrogen and oxygen, a mixed gas atmosphere of rare gas and oxygen, or the like. In this embodiment, heat treatment is performed at 300° C. for one hour under a mixed gas atmosphere of nitrogen and oxygen.

Figure 2D:
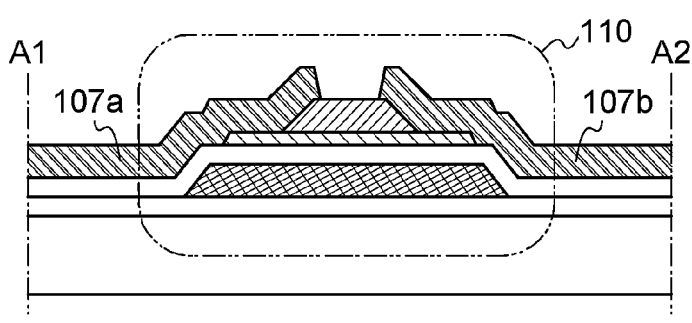
Figure 2E:
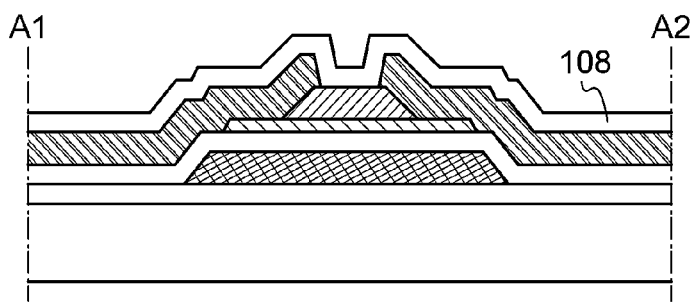

Next, a conductive layer to be the source electrode 107a and the drain electrode 107b is formed over the oxide semiconductor layer 105 and the protective layer 106 (see FIG. 2D).

The conductive layer to be the source electrode 107a and the drain electrode 107b is formed using a material which can withstand heat treatment performed later. As the conductive layer for forming the source electrode 107a and the drain electrode 107b, for example, a metal including an element selected from Al, Cr, Cu, Ta, Ti, Mo, and W or a metal nitride containing any of the above elements as its component (e.g., titanium nitride, molybdenum nitride, or tungsten nitride) can be used. Alternatively, a high-melting-point metal film of Ti, Mo, W, or the like or a metal nitride film of any of these elements (a titanium nitride film, a molybdenum nitride film, or a tungsten nitride film) may be stacked on one of or both a lower side and an upper side of a metal layer of Al, Cu, or the like. Further alternatively, the conductive layer to be the source electrode 107a and the drain electrode 107b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

In this embodiment, for the conductive layer to be the source electrode 107a and the drain electrode 107b, a stacked layer of a 100-nm-thick titanium film, a 400-nm-thick aluminum film, and a 100-nm-thick titanium film is formed by a sputtering method. The conductive layer, which is the stacked layer of the titanium film, the aluminum film, and the titanium film, is etched by an ICP etching method to form the source electrode 107a and the drain electrode 107b (and a wiring which is formed in the same layer as the source electrode 107a and the drain electrode 107b). As a result, the end portions of the source electrode 107a and the drain electrode 107b are each positioned on a top or side surface of the protective layer 106.

The conductive layer can be etched by a method similar to that used for the formation of the gate electrode 103.

In this embodiment, the two layers of titanium and aluminum are etched with first etching conditions, and after that, the other titanium film is etched with second etching conditions. Note that the first etching conditions are as follows: an etching gas of $BCl_3$ and $Cl_2$ ($BCl_3$:$Cl_2$=750 sccm:150 sccm), a bias power of 1500 W, an ICP supply power of 0 W, and a pressure of 2.0 Pa. The second etching conditions are as follows: an etching gas of $BCl_3$ and $Cl_2$ ($BCl_3$:$Cl_2$=700 sccm: 100 sccm), a bias power of 750 W, an ICP supply power of 0 W, and a pressure of 2.0 Pa.

A constituent element in the source electrode 107a and the drain electrode 107b, an element in the treatment chamber, and a constituent element in an etching gas or etchant used for the etching are attached as impurities to the surfaces or the side surfaces, which are exposed due to the formation of the source electrode 107a and the drain electrode 107b, of the oxide semiconductor layer 105 and the protective layer 106 in some cases.

Such attachment of the impurities tends to bring an increase in off-state current of the transistor or the deterioration of the electric characteristics of the transistor. Further, a parasitic channel tends to be generated in the oxide semiconductor layer 105, which leads to electrical connection of electrodes, which need be electrically isolated from each other, through the oxide semiconductor layer 105.

Further, depending on the impurities, the impurities may enter a vicinity of the surface or the side surface of the oxide semiconductor layer 105 to extract oxygen from the oxide semiconductor layer 105, so that oxygen vacancies are generated in the vicinity of the surface or the side surface of the oxide semiconductor layer 105. For example, chlorine or boron contained in the above-described etching gas or aluminum which is a component material in the treatment chamber may cause a reduction in resistance of the oxide semiconductor layer 105 (lead to make the oxide semiconductor layer 105 n-type).

Thus, in one embodiment of the present invention, cleaning treatment for removing an impurity (treatment for removing an impurity) which is attached to the surfaces or the side surfaces of the oxide semiconductor layer 105 and the protective layer 106 is performed after the etching for forming the source electrode 107a and the drain electrode 107b is performed.

As the treatment for removing an impurity, plasma treatment or treatment using a solution can be used. As the plasma treatment, oxygen plasma treatment, dinitrogen monoxide plasma treatment, or the like can be used. Further, a rare gas (a typical example thereof is argon) can be used for the plasma treatment.

Further, for the cleaning treatment using a solution, an alkaline solution such as a TMAH solution, water, or an acidic solution such as diluted hydrofluoric acid can be used. For example, when diluted hydrofluoric acid is used, 50 wt % hydrofluoric acid is diluted with water to approximately $1/10^2$ to $1/10^5$, preferably approximately $1/10^3$ to $1/10^5$. That is, diluted hydrofluoric acid having a concentration of 0.5 wt % to $5 \times 10^{-4}$ wt %, preferably $5 \times 10^{-2}$ wt % to $5 \times 10^{-4}$ wt %, is used for the cleaning treatment. By the cleaning treatment, the above-described impurity attached to the surface of the oxide semiconductor layer 105, the protective layer 106, or the like can be removed.

Further, with the treatment for removing an impurity using a diluted hydrofluoric acid solution, the surfaces or the side surfaces of the protective layer 106 and the oxide semiconductor layer 105 can be etched. That is, an impurity attached to the surfaces or the side surfaces of the protective layer 106 and the oxide semiconductor layer 105 or an impurity entering the vicinity of the surfaces or the side surfaces of the protective layer 106 and the oxide semiconductor layer 105 can be removed with part of the protective layer 106 and the oxide semiconductor layer 105. Accordingly, a region of the oxide semiconductor layer 105 which overlaps with the protective layer 106 is thicker than the other region of the oxide semiconductor layer 105 which does not overlap with the protective layer 106. For example, an IGZO film is processed with $1/10^3$ diluted hydrofluoric acid (0.05 wt % hydrofluoric acid), so that the thickness of the IGZO film is reduced by 1 to 3 nm per second. An IGZO film is processed with $2/10^5$ diluted hydrofluoric acid (0.0025 wt % hydrofluoric acid), so that the thickness of the IGZO film is reduced by approximately 0.1 nm per second.

By performing the treatment for removing an impurity, the chlorine concentration at the surfaces of the insulating layer and the oxide semiconductor layer can be reduced to be lower than or equal to $1\times10^{19}/cm^3$ (preferably lower than or equal to $5\times10^{18}/cm^3$, more preferably lower than or equal to $1\times10^{18}/cm^3$) in a concentration peak obtained by SIMS. The boron concentration can be reduced to be lower than or equal to $1\times10^{19}/cm^3$ (preferably lower than or equal to $5\times10^{18}/cm^3$, more preferably lower than or equal to $1\times10^{18}/cm^3$). The aluminum concentration can be reduced to be lower than or equal to $1\times10^{19}/cm^3$ (preferably lower than or equal to $5\times10^{18}/cm^3$, more preferably lower than or equal to $1\times10^{18}/cm^3$).

The treatment for removing an impurity enables the highly reliable transistor 110 having stable electric characteristics to be provided.

The treatment for removing an impurity may be performed after the protective layer 106 functioning as a channel protective layer is formed before the source electrode 107a and the drain electrode 107b are formed. The treatment for removing an impurity is performed after the protective layer 106 is formed enables an impurity attached to the surface of the oxide semiconductor layer 105 to be removed.

In this manner, the transistor 110 can be manufactured. Note that even when the above-described cleaning treatment is performed, an impurity such as moisture or carbon contained in the air attached to the surfaces or the side surfaces of the oxide semiconductor layer 105, the protective layer 106, the source electrode 107a, and the drain electrode 107b in some cases. Therefore, the insulating layer 108 may be provided over the protective layer 106, the source electrode 107a, and the drain electrode 107b (see FIG. 2E). The insulating layer 108 can be formed using a material and a method similar to those of the insulating layer 102, the gate insulating layer 104, and the protective layer 106. Further, for the insulating layer 108, a material which contains an impurity such as moisture, an hydrogen ion, or OH⁻ as less as possible, and which can prevent these impurities entering from the outside is preferably used.

After the formation of the insulating layer 108, oxygen (including at least any one of oxygen radicals, oxygen atoms, and oxygen ions) may be introduced into the insulating layer 108 so that the insulating layer 108 is in an oxygen-excess state. For the introduction of oxygen, an ion implantation method, an ion doping method, a plasma immersion ion implantation method, plasma treatment performed under an oxygen atmosphere, or the like can be employed.

By introduction of oxygen, a bond between a constituent element in the insulating layer 108 and hydrogen or a bond between the constituent element and a hydroxy group is cleaved, and the hydrogen or the hydroxy group reacts to oxygen to generate water. Thus, heat treatment is performed after introduction of oxygen facilitates elimination of the hydrogen or the hydroxyl group which is an impurity as water. Therefore, heat treatment may be performed after oxygen is introduced into the insulating layer 108. After that, oxygen may be introduced again into the insulating layer 108 so that the insulating layer 108 is in an oxygen-excess state.

Note that the hydrogen concentration in the insulating layer 108 is preferably lower than $5\times10^{18}$ atoms/cm³, more preferably lower than or equal to $1\times10^{18}$ atoms/cm³, still more preferably lower than or equal to $5\times10^{17}$ atoms/cm³, further more preferably lower than or equal to $1\times10^{16}$ atoms/cm³.

Further, before the insulating layer 108 is formed, an impurity such as moisture or an organic substance which is attached to the surface or the side surfaces of the oxide semiconductor layer 105, the protective layer 106, the source electrode 107a, and the drain electrode 107b is preferably removed by plasma treatment using oxygen, dinitrogen monoxide, a rare gas (a typical example thereof is argon), or the like. The insulating layer 108 is preferably formed successively without exposure to the air after oxygen plasma treatment, dinitrogen monoxide plasma treatment, or the like is performed.

Further, for the insulating layer 108, a dense inorganic insulating film may be provided. For example, for the insulating layer 108, an aluminum oxide film formed by a sputtering method is used. Providing an aluminum oxide film having high density (the film density is higher than or equal to 3.2 g/cm³, preferably higher than or equal to 3.6 g/cm³) can stabilize the electric characteristics of the transistor 110. The film density can be measured by Rutherford backscattering spectrometry (RBS) or X-ray reflectometry (XRR).

The aluminum oxide film can function as a protective insulating layer of the transistor 110, and has a high blocking effect that neither oxygen nor an impurity such as hydrogen or moisture passes through the film.

Therefore, in and after the manufacturing process, the aluminum oxide film prevents entry of an impurity such as hydrogen or moisture, which causes a change, into the oxide semiconductor layer 105 and release of oxygen, which is a main constituent material of the oxide semiconductor, from the oxide semiconductor layer 105. In this embodiment, an aluminum oxide film is formed by a sputtering method as the insulating layer 108.

After the transistor 110 is formed or after the insulating layer 108 is formed over the transistor 110, heat treatment may be further performed at a temperature higher than or equal to 100° C. and lower than or equal to 300° C. for 1 to 30 hours in the air. This heat treatment may be performed at a fixed heating temperature. Alternatively, it is possible that the following change in temperature is set as one cycle and repeated plural times: the temperature is increased from room temperature to a heating temperature and then decreased to room temperature.

According to this embodiment, a highly reliable semiconductor device which includes a transistor having stable electric characteristics can be provided. Further, a highly reliable semiconductor device can be manufactured at a high yield, whereby productivity can be improved.

This embodiment can be combined with any of the other embodiments as appropriate.

[Embodiment 2]

Figure 3A:
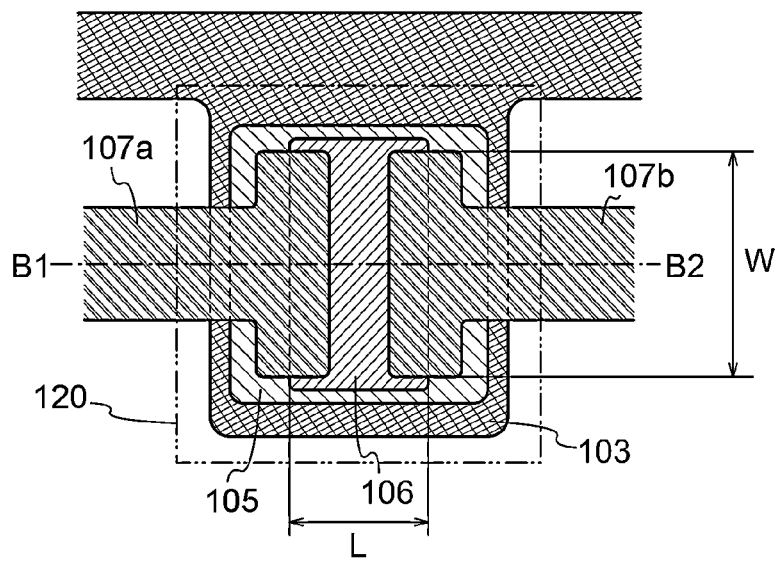
FIGS. 3A to 3C illustrate structures of a semiconductor device.
Figure 3B:
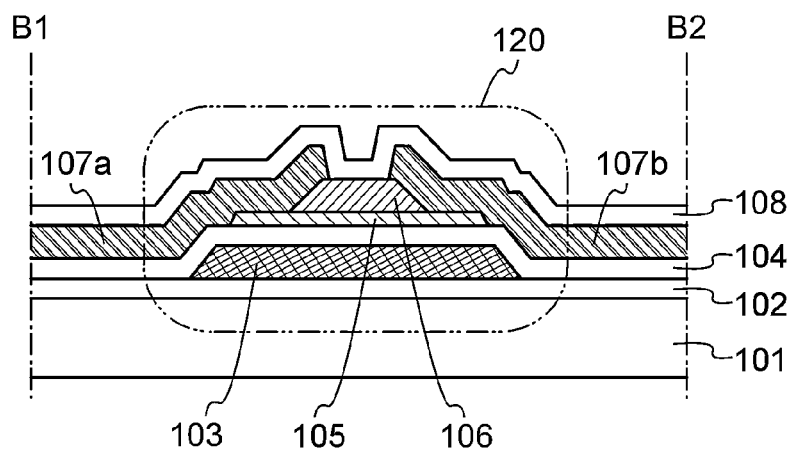
Figure 3C:
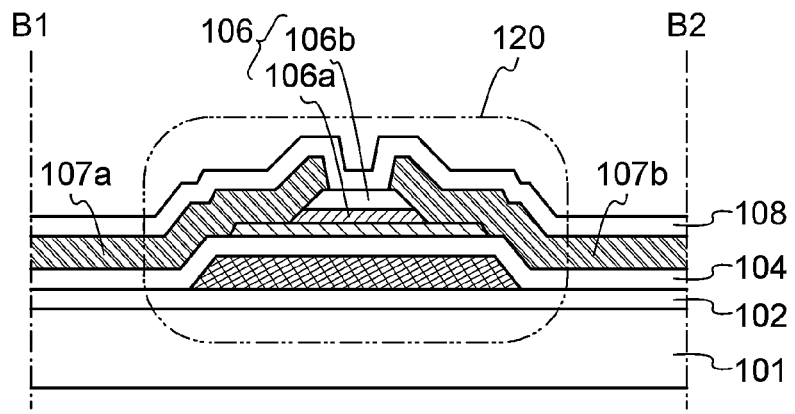

In this embodiment, as an embodiment of the semiconductor device, a transistor having a structure which is different from that of the transistor 110 disclosed in the above embodiments and a method for manufacturing the transistor are described with reference to FIGS. 3A to 3C, FIGS. 4A1 to 4A3 and 4B1 to 4B3, and FIGS. 5A1 to 5A3 and 5B1 to 5B3. FIG. 3A is a top view illustrating a planar structure of a transistor 120 including an oxide semiconductor in a semiconductor layer in which a channel is formed. FIG. 3B is a cross-sectional view illustrating a cross-sectional structure taken along a chain line B1-B2 in FIG. 3A. FIG. 3C is a cross-sectional view illustrating a cross-sectional structure, which is different from that in FIG. 3B, taken along the chain line B1-B2 in FIG. 3A. Note that the illustration of the substrate 101, the insulating layer 102, the gate insulating layer 104, the protective layer 106b, and the insulating layer 108 is omitted in FIG. 3A for easy understanding.

The transistor 120 illustrated in FIGS. 3A to 3C is a channel-protected (also referred to as channel-stop) transistor, which is the same type as the transistor 110. In this embodiment, the structures of the transistor 120 which are different from those of the transistor 110 and the manufacturing method thereof are described.

In the transistor 110, the protective layer 106 extends beyond the end portions of the oxide semiconductor layer 105 in the channel width direction; on the other hand, in the transistor 120, the protective layer 106 is formed on the inner side than the oxide semiconductor layer 105 in the channel width direction. That is, in the transistor 120, the oxide semiconductor layer 105 extends beyond the end portions of the protective layer 106 in the channel width direction. With such a structure, the formation of the oxide semiconductor layer 105 and the formation of the protective layer 106 can be performed by one photolithography process, so that the semiconductor device can be manufactured with improved productivity.

Further, FIG. 3C illustrates a structural example in which the protective layer 106 has a stacked structure of a protective layer 106a and a protective layer 106b. One of the protective layers 106a and 106b is formed using a material and a method similar to those of the insulating layer 102 or the gate insulating layer 104, and the other is formed using the material represented by the chemical formula $InMZnO_X$ (X>0) or the material represented by the chemical formula $InM_{1X}M_{2(1-X)}ZnO$ (0<X<1+α where α is less than 0.3 and (1−X) >0).

For example, the protective layer 106a which is in contact with the oxide semiconductor layer 105 is formed using the material represented by the chemical formula $InMZnO_X$ or the material represented by the chemical formula $M_{1X}M_{2(1-X)}ZnO$ (0<X<1+α where α is less than 0.3 and (1−X)>0), and the protective layer 106b over the protective layer 106a is formed using a material having a higher etching rate than a material for the protective layer 106a, so that in addition to the effects described in Embodiment 1, the end portions of the protective layer 106 can be easily tapered. Further, the protective layer 106 is formed to have a stacked structure of a plurality of layers, so that the end portions of the protective layer 106 each have a step shape, and disconnection of a layer provided over the protective layer 106 is prevented; accordingly, coverage can be improved.

Further, the protective layer 106a which is in contact with the oxide semiconductor layer 105 is formed using a material containing a lot of oxygen, and the protective layer 106b over the protective layer 106a is formed using the material represented by the chemical formula $InMZnO_X$ or the material represented by the chemical formula $InM_{1X}M_{2(1-X)}ZnO$ (0<X<1+α where α is less than 0.3 and (1−X)>0), so that in addition to the effects described in Embodiment 1, oxygen is supplied to the oxide semiconductor layer 105, and the oxygen vacancies in the oxide semiconductor layer 105 can be filled. Consequently, a highly reliable semiconductor device having stable electric characteristics can be provided.

Next, a method for manufacturing the transistor 120 in which the oxide semiconductor layer 105 and the protective layer 106 are formed by one photolithography process is described with reference to FIGS. 4A1 to 4A3 and 4B1 to 4B3 and FIGS. 5A1 to 5A3 and 5B1 to 5B3. FIGS. 4A1 to 4A3 are top views in the middle of the manufacturing process of the transistor 120. FIGS. 4B1 to 4B3 are cross-sectional views illustrating cross-sectional structures taken along a chain line B1-B2 in FIGS. 4A1 to 4A3. FIGS. 5A1 to 5A3 are top views in the middle of the manufacturing process of the transistor 120. FIGS. 5B1 to 5B3 are cross-sectional views illustrating cross-sectional structures taken along a chain line B1-B2 in FIGS. 5A1 to 5A3.

Hereinafter, a method for manufacturing the transistor 120 is described. First, the insulating layer 102 is formed over the substrate 101, and then the gate electrode 103 is formed over the insulating layer 102, as in the manufacturing method described in Embodiment 1. Next, the gate insulating layer 104, an oxide semiconductor layer 201, and an insulating layer 202 are formed over the gate electrode 103 (see FIGS. 4A1 and 4B1). The gate insulating layer 104, the oxide semiconductor layer 201, and the insulating layer 202 are preferably formed successively without exposure to the air. The oxide semiconductor layer 201 can be formed using a material and a method similar to those of the oxide semiconductor layer to be the oxide semiconductor layer 105 described in Embodiment 1. Further, the insulating layer 202 can be formed using a material and a method similar to those of the insulating layer to be the protective layer 106 described in Embodiment 1.

Next, a resist mask including regions with different thicknesses is formed over the insulating layer 202. The resist mask having regions with different thicknesses can be formed with the use of a multi-tone mask. The usage of the multi-tone mask makes it possible to form the oxide semiconductor layer 105 and the protective layer 106 with one photo mask; accordingly, the number of the photolithography process can be reduced.

A multi-tone mask is a mask capable of light exposure with multi-level light intensity; in most cases, light exposure is performed with three levels of light intensity to provide an exposed region, a half-exposed region, and an unexposed region. With the use of a multi-tone mask, a resist mask having regions with different thicknesses (in most cases, two kinds of thicknesses) can be formed by one-time exposure and development process. Therefore, with the use of a multi-tone mask, the number of photomasks can be reduced.

A multi-tone mask is described with reference to FIGS. 6A1, 6A2, 6B1, and 6B2. FIGS. 6A1 and 6B1 are cross-sectional views of typical multi-tone masks. FIG. 6A1 shows a gray-tone mask 304 and FIG. 6B1 shows a half-tone mask 314.

The gray-tone mask 304 illustrated in FIG. 6A1 includes, on a light-transmitting substrate 301, a light-blocking portion 302 formed using a light-blocking layer and a diffraction grating portion 303 formed by the pattern of the light-blocking layer.

The diffraction grating portion 303 has slits, dots, meshes, or the like provided at intervals which are less than or equal to the resolution limit of light used for the exposure, whereby the light transmittance can be controlled. Note that the slits, dots, or meshes provided at the diffraction grating portion 303 may be provided periodically or non-periodically.

Quartz or the like can be used as the light-transmitting substrate 301. The light-blocking layer included in the light-blocking portion 302 and the diffraction grating portion 303 may be formed using a metal film, and is preferably formed using chromium, chromium oxide, or the like.

In the case where the gray-tone mask 304 is irradiated with light for light exposure, as illustrated in FIG. 6A2, the light transmittance of the region overlapping with the light-blocking portion 302 is 0%, and the light transmittance of the region where neither the light-blocking portion 302 nor the diffraction grating portion 303 is provided is 100%. Further, the light transmittance of the diffraction grating portion 303 is approximately in the range of 10% to 70%, which can be adjusted by the interval of slits, dots, or meshes of the diffraction grating, or the like.

The half-tone mask 314 illustrated in FIG. 6B1 includes, on a light-transmitting substrate 311, a semi-light-transmitting portion 312 and a light-blocking portion 313 which are formed using a semi-light-transmitting layer and a light-blocking layer, respectively.

The semi-light-transmitting portion 312 can be formed by using a layer of MoSiN, MoSi, MoSiO, MoSiON, CrSi, or the like. The light-blocking portion 313 may be formed using a metal film which is similar to that of the light-blocking layer of the gray-tone mask, and is preferably formed using chromium, chromium oxide, or the like.

In the case where the half-tone mask 314 is irradiated with light for light exposure, as illustrated in FIG. 6B2, the light transmittance of the region overlapping with the light-blocking portion 313 is 0%, and the light transmittance of the region where neither the light-blocking portion 313 nor the semi-light-transmitting portion 312 is provided is 100%. Further, the light transmittance of the semi-light-transmitting portion 312 is approximately in the range of 10% to 70%, which can be adjusted by the kind of material, thickness of a film, or the like.

Since a multi-tone mask can achieve three levels of exposure to obtain an exposed portion, a half-exposed portion, and an unexposed portion, a resist mask having regions with different thicknesses (in most cases, two kinds of thicknesses) can be formed by one-time exposure and development process. Thus, the number of photomasks used in the manufacturing process of the transistor 120 can be reduced with the use of the multi-tone mask.

Accordingly, a resist mask 203 is formed thick over a region in which the protective layer 106 is to be formed, and is formed thin over the other region (see FIGS. 4A2 and 4B2). Note that the resist mask 203 is not formed over a region in which neither the protective layer 106 or the oxide semiconductor layer 105 is formed.

Next, part of the insulating layer 202 and part of the oxide semiconductor layer 201 are selectively removed (etched) with the use of the resist mask 203. The insulating layer 202 and the oxide semiconductor layer 105 which are processed into island shapes are formed by the etching (see FIG. 4A3 and 4B3).

Next, the resist mask 203 is made to be reduced in size (to recede), and a thin region of the resist mask 203 is removed, so that a resist mask 204 is formed. In order to reduce the size of the resist mask 203 (to make the resist mask 203 recede), ashing by oxygen plasma may be employed, for example. The resist mask 204 is formed on the inner side than the oxide semiconductor layer 105 because the size of the resist mask 203 is reduced (recedes) not only in the film thickness direction but also in the plane direction (FIGS. 5A1 and 5B1).

Next, the insulating layer 202 which is processed into an island shape is etched with the use of the resist mask 204, so that the protective layer 106 is formed (see FIGS. 5A2 and 5B2). The resist mask 204 is removed after the etching (see FIGS. 5A3 and 5B3).

When the insulating layer 202 is etched with a condition under which the resist mask 204 is also etched, the side surface of the protective layer 106 is easily tapered. Further, the taper angle θ of the side surface of the protective layer 106 can be controlled by adjusting the etching rate to the resist mask 204 and the etching rate to the protective layer 106 as appropriate in the etching conditions.

The following manufacturing steps can be performed as in the case of the transistor 110 described in Embodiment 1. In steps for manufacturing the semiconductor device, an increase in number of used photomasks leads to an increase in number of photolithography process, which causes a decrease in yield or an increase in production cost. According to this embodiment, a semiconductor device can be manufactured with fewer photolithography process; thus, the semiconductor device can be manufactured with improved productivity.

This embodiment can be combined with any of the other embodiments as appropriate.

[Embodiment 3]

Figure 7A:
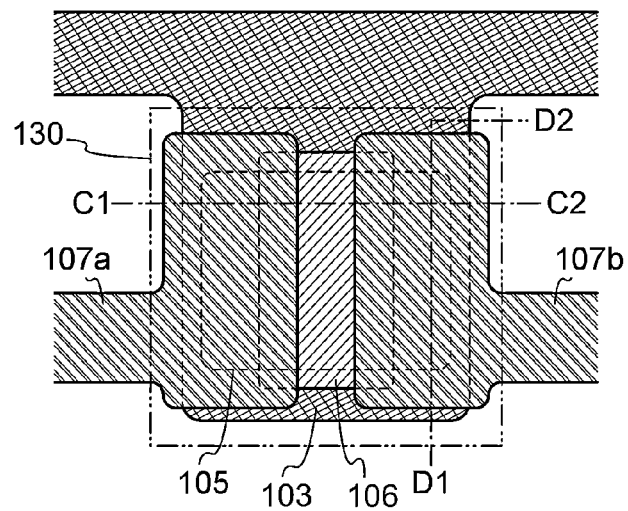
FIGS. 7A to 7C illustrate a structure of a semiconductor device.
Figure 7B:
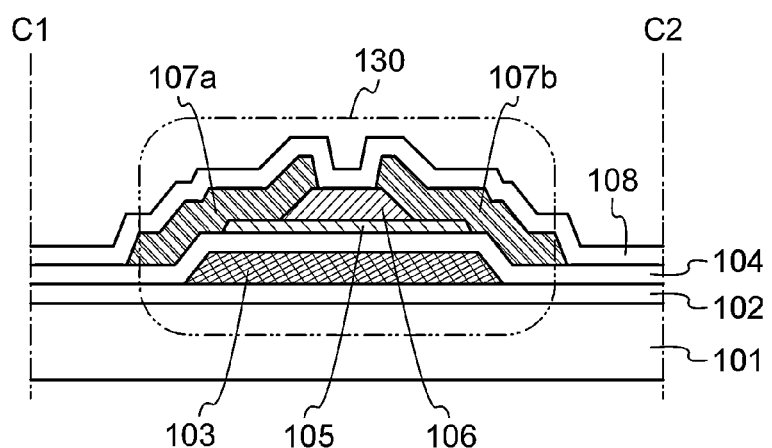
Figure 7C:
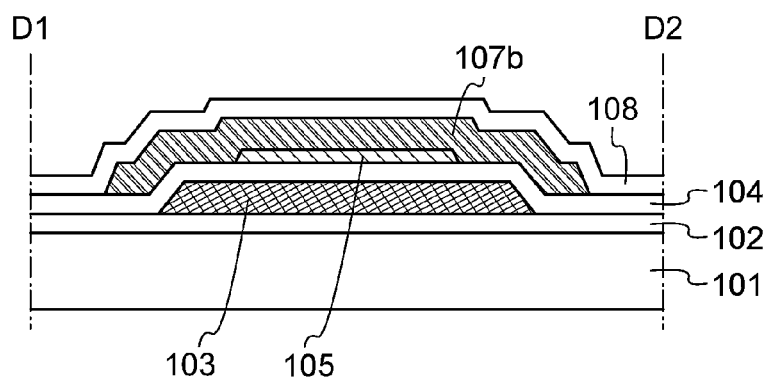

In this embodiment, as one embodiment of the semiconductor device, a transistor having a structure which is different from that of the transistor 110 disclosed in the above embodiments is described with reference to FIGS. 7A to 7C. FIG. 7A is a top view illustrating a planar structure of a transistor 130 including an oxide semiconductor in a semiconductor layer in which a channel is formed. FIG. 7B is a cross-sectional view illustrating a cross-sectional structure taken along a chain line C1-C2 in FIG. 7A. FIG. 7C is a cross-sectional view illustrating a cross-sectional structure of a portion taken along a chain line D1-D2 in FIG. 7A. Note that the illustration of the substrate 101, the insulating layer 102, the gate insulating layer 104, and the insulating layer 108 is omitted in FIG. 7A for easy understanding.

The transistor 130 can be manufactured similarly to the transistor 110 described in Embodiment 1. The transistor 130 is different from the transistor 110 in that the oxide semiconductor layer 105 is completely covered with the protective layer 106, the source electrode 107a, and the drain electrode 107b.

Further, the treatment for removing an impurity described in Embodiment 1 may be performed after the protective layer 106 is formed. Further, since the oxide semiconductor layer 105 is completely covered with the protective layer 106, the source electrode 107a, and the drain electrode 107b, the transistor 130 disclosed in this embodiment is not easily affected by an impurity generated in formation of the source electrode 107a and the drain electrode 107b. Thus, reliability of the semiconductor device can be improved. Further, the treatment for removing an impurity performed after formation of the source electrode 107a and the drain electrode 107b can be skipped, so that the semiconductor device can be manufactured with improved productivity.

This embodiment can be combined with any of the other embodiments as appropriate.

[Embodiment 4]

Figure 8A:
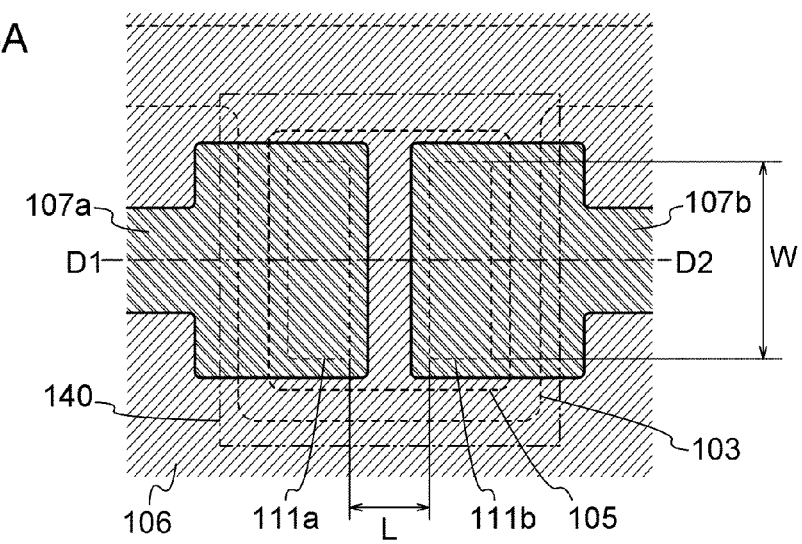
FIGS. 8A to 8C illustrate structures of a semiconductor device.
Figure 8B:
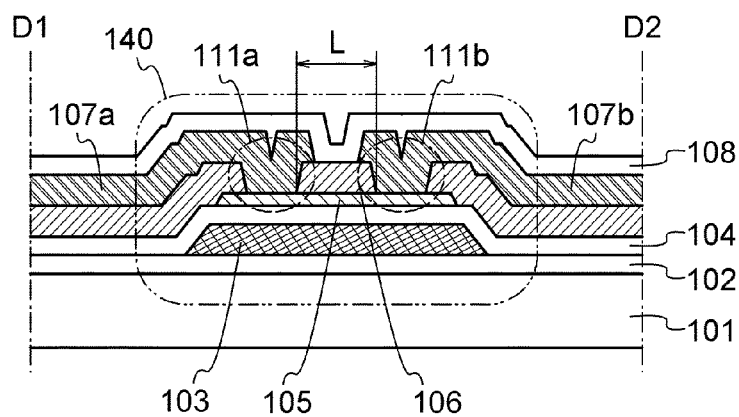
Figure 8C:
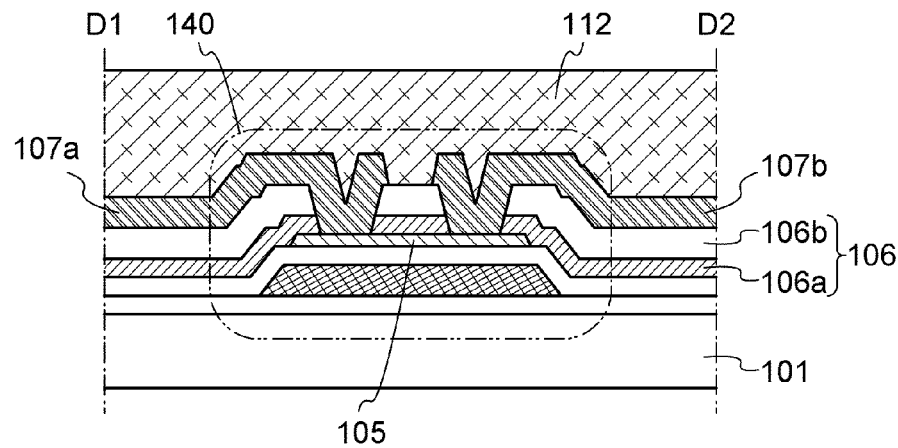

In this embodiment, examples of transistors having structures different from those of the transistors disclosed in the above embodiments are described with reference to FIGS. 8A to 8C. FIG. 8A is a top view illustrating a planar structure of a transistor 140 including an oxide semiconductor in a semiconductor layer in which a channel is formed. FIG. 8B is a cross-sectional view illustrating a cross-sectional structure taken along a chain line D1-D2 in FIG. 8A. FIG. 8C is also a cross-sectional view illustrating a cross-sectional structure taken along the chain line D1-D2 in FIG. 8A, and illustrates a modification example of the cross-sectional structure illustrated in FIG. 8B. Note that the illustration of the substrate 101, the insulating layer 102, the gate insulating layer 104, the protective layer 106b, the insulating layer 108, and a planarization layer 112 is omitted in FIG. 8A for easy understanding.

The transistor 140 can be manufactured similarly to any of the transistors described in the above embodiments. The transistor 140 is different in that contact holes 111a and 111b are included in the protective layer 106.

Hereinafter, a method for manufacturing the transistor 140 is described. First, as in the manufacturing method described in the above embodiments, the insulating layer 102 is formed over the substrate 101, and then the gate electrode 103 is formed over the insulating layer 102. Next, the gate insulating layer 104 is formed over the gate electrode 103, the oxide semiconductor layer 105 is formed over the insulating layer 104, and the protective layer 106 is formed over the oxide semiconductor layer 105.

Next, part of the protective layer 106 which overlaps with the oxide semiconductor layer 105 is selectively removed (etched), so that the contact holes 111a and 111b are formed. In this manner, the protective layer 106 including the opening portions (contact holes) is formed. Note that the oxide semiconductor layer 105 is exposed at the bottom portions of the contact holes 111a and 111b. The contact holes 111a and 111b, which are the opening portions, can be formed similarly to the island-shaped protective layer 106 described in the above embodiments.

When the protective layer 106 including the opening portions is formed by a dry etching method, the treatment for removing an impurity described in Embodiment 1 may be performed in order to prevent an impurity from remaining on the surfaces of the protective layer 106 and the exposed oxide semiconductor layer 105. As the treatment for removing an impurity, plasma treatment or treatment using a solution can be performed similarly to the step described in Embodiment 1. As the plasma treatment, oxygen plasma treatment, dinitrogen monoxide plasma treatment, or the like can be used. Further, a rare gas (a typical example thereof is argon) can be used for the plasma treatment. As the treatment using a solution, cleaning treatment using a diluted hydrofluoric acid solution can be used. For example, when a diluted hydrofluoric acid solution is used, 50 wt % hydrofluoric acid is diluted to approximately $1/10^2$ to $1/10^5$, preferably approximately $1/10^3$ to $1/10^5$. Further, as the treatment using a solution, treatment using an alkaline solution such as a TMAH solution may be performed. Further, cleaning treatment may be performed using water instead of a solution.

Next, the source electrode 107a and the drain electrode 107b are formed to cover the contact holes 111a and 111b. The source electrode 107a and the drain electrode 107b can be formed using a material and a method similar to those in the above embodiments. The source electrode 107a is connected to the oxide semiconductor layer 105 through the contact hole 111a, and the drain electrode 107b is connected to the oxide semiconductor layer 105 through the contact hole 111b. In this manner, the transistor 140 can be manufactured.

Further, since the oxide semiconductor layer 105 is completely covered with the protective layer 106, the source electrode 107a, and the drain electrode 107b, the transistor 140 disclosed in this embodiment is not easily affected by an impurity generated in the formation of the source electrode 107a and the drain electrode 107b. Thus, reliability of the semiconductor device can be improved. Further, the treatment for removing an impurity performed after the formation of the source electrode 107a and the drain electrode 107b can be skipped, so that the semiconductor device can be manufactured with improved productivity.

The insulating layer 108 may be formed over the source electrode 107a and the drain electrode 107b. The insulating layer 108 can be formed using a material and a method similar to those in the above embodiments.

Note that a channel region of the transistor 140 is formed between the contact holes 111a and 111b in the oxide semiconductor layer 105 which overlaps with the gate electrode 103. That is, the channel length L of the transistor 140 is defined as a minimum distance between the contact holes 111a and 111b formed over the oxide semiconductor layer 105 in a direction parallel to the direction in which carriers flow. Further, the channel width W of the transistor 140 is defined as a shorter length or an average length of the following two lengths in a direction perpendicular to the direction in which carriers flow: the length of the contact hole 111a and the length of the contact hole 111b.

FIG. 8C illustrates a structural example of the transistor 140 in which the protective layer 106 has a stacked structure of the protective layer 106a and the protective layer 106b and the planarization layer 112 is formed over the source electrode 107a and the drain electrode 107b. The protective layers 106a and 106b can be formed using a material and a method similar to those in the above embodiments. The protective layer 106 including the opening portions has a stacked structure, so that an effect similar to that obtained when the island-shaped protective layer 106 has a stacked structure described in the above embodiment can be expected.

In order to reduce surface roughness caused by the transistor 140, the planarization layer 112 may be formed as illustrated in FIG. 8C. For the planarization layer 112, an organic material such as polyimide, an acrylic resin, a benzocyclobutene-based resin, polyamide, or an epoxy resin can be used. Other than such organic materials, it is also possible to use a low-dielectric constant material (a low-k material), a siloxane-based resin, phosphosilicate glass (PSG), borophosphosilicate glass (BPSG), or the like. Note that the planarization layer 112 may be formed by stacking a plurality of insulating layers formed using these materials.

There is no particular limitation on the method for forming the planarization layer 112, and the planarization layer 112 can be formed, depending on the material, by a sputtering method, a spin coating method, a dipping method, spray coating, a droplet discharge method (e.g., an inkjet method or the like), a printing method (e.g., screen printing, offset printing, or the like), roll coating, curtain coating, knife coating, or the like.

For example, a 1500-nm-thick acrylic resin layer may be formed as the planarization layer 112. The acrylic resin layer can be formed as follows: coating is performed by a spin coating method and then, baking is performed (at 250° C. for one hour under a nitrogen atmosphere, for example).

After the planarization layer 112 is formed, heat treatment may be performed. For example, heat treatment is performed under a nitrogen atmosphere at 250° C. for one hour.

This embodiment can be combined with any of the other embodiments as appropriate.

[Embodiment 5]

Figure 9A:
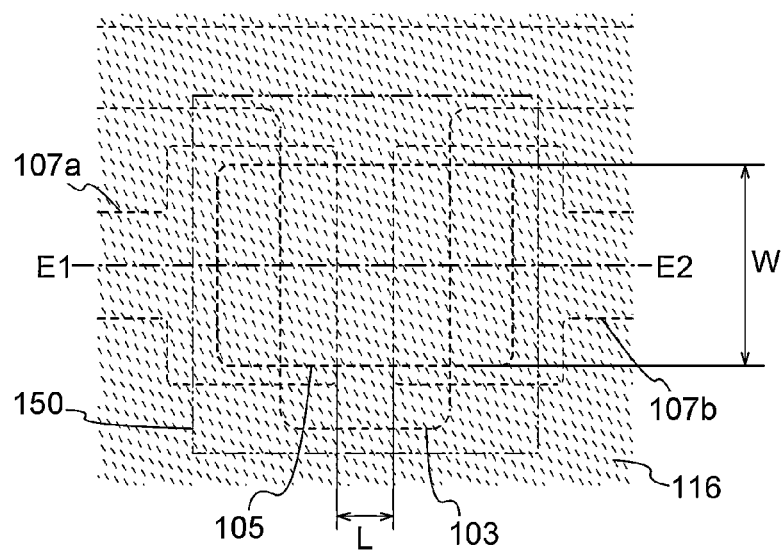
FIGS. 9A to 9C illustrate structures of a semiconductor device.
Figure 9B:
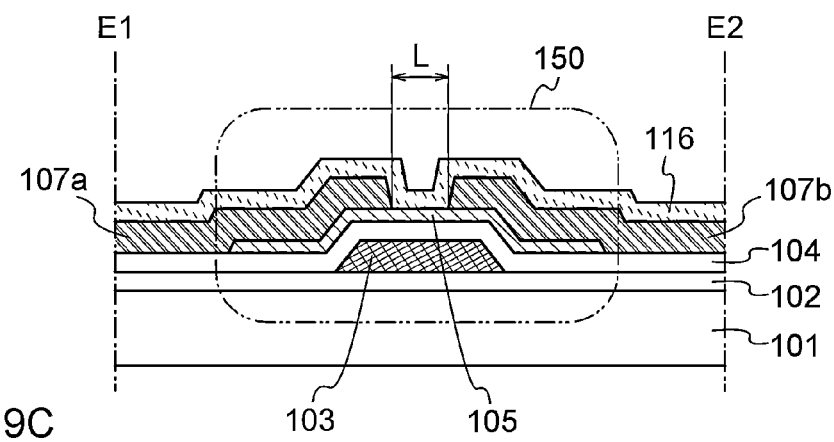
Figure 9C:
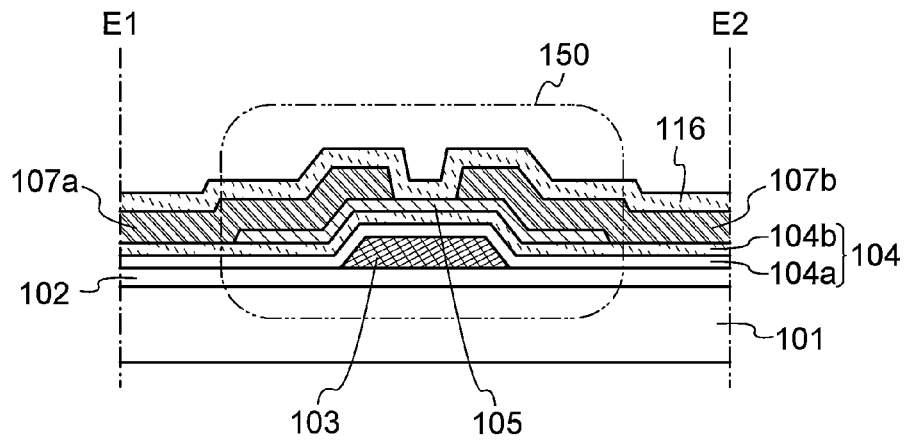

In this embodiment, examples of transistors having structures different from those of the transistors disclosed in the above embodiments are described with reference to FIGS. 9A to 9C. FIG. 9A is a top view illustrating a planar structure of a transistor 150 including an oxide semiconductor in a semiconductor layer in which a channel is formed. FIG. 9B is a cross-sectional view illustrating a cross-sectional structure taken along a chain line E1-E2 in FIG. 9A. FIG. 9C is also a cross-sectional view illustrating a cross-sectional structure taken along the chain line E1-E2 in FIG. 9A, and illustrates a modification example of the cross-sectional structure illustrated in FIG. 9B. Note that the illustration of the substrate 101, the insulating layer 102, and the gate insulating layer 104 is omitted in FIG. 9A for easy understanding.

The transistor 150 illustrated in FIGS. 9A to 9C is a kind of bottom-gate transistor having a channel-etched structure and also a kind of inverted staggered transistor.

The channel-etched transistor 150 is different from the transistor 110, the transistor 120, the transistor 130, and transistor 140, which are described in the above embodiments, in that the protective layer 106 functioning as a channel protective layer is not formed between the oxide semiconductor layer 105 and each of the source electrode 107a and the drain electrode 107b. Thus, the transistor 150 can be manufactured with fewer photolithography process than the transistor 110, the transistor 130, and the transistor 140 without using a multi-tone mask.

Hereinafter, a method for manufacturing a transistor 150 is described. First, as in the manufacturing method described in the above embodiments, the insulating layer 102 is formed over the substrate 101, and then the gate electrode 103 is formed over the insulating layer 102. Next, the gate insulating layer 104 is formed over the gate electrode 103, and the oxide semiconductor layer 105 is formed over the insulating layer 104.

Next, a conductive layer is formed over the oxide semiconductor layer 105, and the source electrode 107a and the drain electrode 107b are formed by a photolithography process. A material and a method for forming the source electrode 107a and the drain electrode 107b can be similar to the material and the method described in the above embodiments.

Note that a channel region of the transistor 150 is formed between the source electrode 107a and the drain electrode 107b in the oxide semiconductor layer 105 which overlaps with the gate electrode 103. That is, the channel length L of the transistor 150 is defined as a minimum distance between, in a region of the oxide semiconductor layer 105 which overlaps with the gate electrode 103, an end portion of the source electrode 107a which is in contact with the oxide semiconductor layer 105 and an end portion of the drain electrode 107b which is in contact with the oxide semiconductor layer 105. Further, the channel width W of the transistor 150 is defined as a shorter length or an average length of the following two lengths in a direction perpendicular to the channel length L in a region of the oxide semiconductor layer 105 which overlaps with the gate electrode 103: the length of a region in which the oxide semiconductor layer 105 is in contact with the source electrode 107a and the length of a region in which the oxide semiconductor layer 105 is in contact with the drain electrode 107b.

The treatment for removing an impurity described in Embodiment 1 is performed after the source electrode 107a and the drain electrode 107b are formed. Since the transistor 150 is a channel-etched transistor, when an impurity is attached to the channel region after the source electrode 107a and the drain electrode 107b are formed, an increase in off-state current of the transistor or the deterioration of the electric characteristics of the transistor due to a short circuit between the source electrode 107a and the drain electrode 107b tends to be caused. Consequently, the highly reliable transistor 110 having stable electric characteristics can be provided by performing the treatment for removing an impurity after the source electrode 107a and the drain electrode 107b are formed.

Next, a protective layer 116 is formed over the source electrode 107a and the drain electrode 107b to be in contact with part of the oxide semiconductor layer 105. The protective layer 116 can be formed using a material and a method similar to those of the insulating layer 102, the gate insulating layer 104, the protective layer 106, and the insulating layer 108.

Further, before the formation of the protective layer 116, moisture or an organic substance which is attached to the surfaces of the oxide semiconductor layer 105, the source electrode 107a, and the drain electrode 107b is preferably removed by performing oxygen plasma treatment, dinitrogen monoxide plasma treatment, or the like. The protective layer 116 is preferably formed successively without exposure to the air after oxygen plasma treatment, dinitrogen monoxide plasma treatment, or the like is performed.

The material represented by the chemical formula $InMZnO_X$ (X>0) or the material represented by the chemical formula $InM_{1X}M_{2(1-X)}ZnO$ (0<X<1+α where α is less than 0.3 and (1−X)>0) is used for the protective layer 116, so that the condition of the interface between the back-channel-side oxide semiconductor layer 105 and the protective layer 116 can be kept good. Consequently, a highly reliable semiconductor device having stable electric characteristics can be provided.

Further, an oxide semiconductor having a higher insulating property than the oxide semiconductor layer 105 is provided over or under the oxide semiconductor layer 105, so that a parasitic channel is not generated and thus, variation in threshold voltage due to charge buildup of the insulating layer is suppressed. Consequently, characteristic deterioration of or damage to the transistor due to static electricity or the like can be prevented, so that a semiconductor device can be manufactured with high yield and thus, the semiconductor device can be manufactured with improved productivity. Further, reliability of the semiconductor device can be improved. As the oxide semiconductor having a higher insulating property than the oxide semiconductor layer 105, any material represented by the above chemical formula can be used.

Further, FIG. 9C illustrates a structural example in which the gate insulating layer 104 has a stacked structure of gate insulating layers 104a and 104b. One of the gate insulating layers 104a and 104b is formed using a material and a method similar to those in the insulating layer 102 or the gate insulating layer 104, and the other is formed using the material represented by the chemical formula $InMZnO_X$ (X>0) or the material represented by the chemical formula $InM_{1X}M_{2(1-X)}ZnO$.

For example, the gate insulating layer 104b in contact with the oxide semiconductor layer 105 is formed using the material represented by the chemical formula $InMZnO_X$ or the material represented by the chemical formula $M_{1X}M_{2(1-X)}ZnO$, so that the condition of the interface between the oxide semiconductor layer 105 and the gate insulating layer 104b can be kept clean, and the characteristics of the transistor can be favorable. Consequently, a highly reliable semiconductor device having stable electric characteristics can be provided.

Further, insulating layers are formed using the material represented by the chemical formula $InMZnO_X$ (X>0) or the material represented by the chemical formula $InM_{1X}M_{2(1-X)}ZnO$ under and over the oxide semiconductor layer 105, so that reliability of the semiconductor device can be improved.

This embodiment can be combined with any of the other embodiments as appropriate.

[Embodiment 6]

A semiconductor device (also referred to as a display device) having a display function can be manufactured using the transistor an example of which is described in the above embodiments. Moreover, some or all of the driver circuits which include the transistor can be formed over a substrate where the pixel portion is formed, whereby a system-on-panel can be obtained. In this embodiment, an example of a display device including the transistor whose example is described in any of the above embodiments is described with reference to FIGS. 10A to 10C and FIGS. 11A and 11B. Note that FIGS. 11A and 11B are cross-sectional views illustrating cross-sectional structures taken along a chain line M-N in FIG. 10B.

Figure 10A:
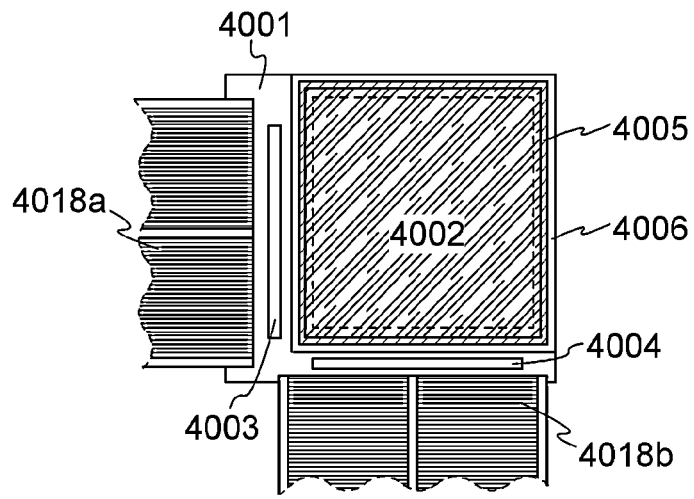
FIGS. 10A to 10C illustrate structures of a semiconductor device.

In FIG. 10A, a sealant 4005 is provided to surround a pixel portion 4002 provided over a first substrate 4001, and the pixel portion 4002 is sealed with a second substrate 4006. In FIG. 10A, a scan line driver circuit 4004 and a signal line driver circuit 4003 each are formed using a single-crystal semiconductor or a polycrystalline semiconductor over a substrate prepared separately, and mounted in a region different from the region surrounded by the sealant 4005 over the first substrate 4001. Various signals and potentials are supplied to the signal line driver circuit 4003, the scan line driver circuit 4004, or the pixel portion 4002 from a flexible printed circuit (FPC) 4018a and an FPC 4018b.

Figure 10B:
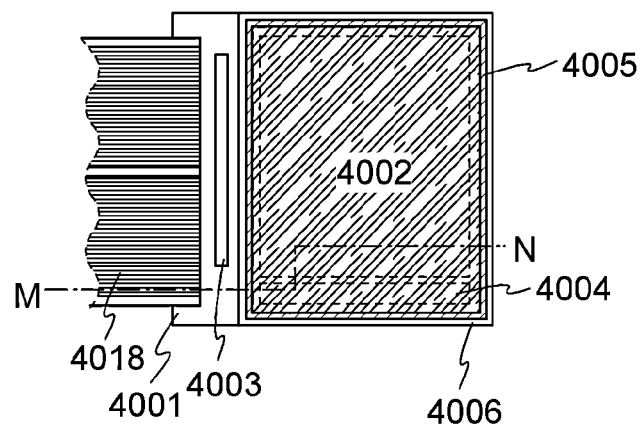
Figure 10C:
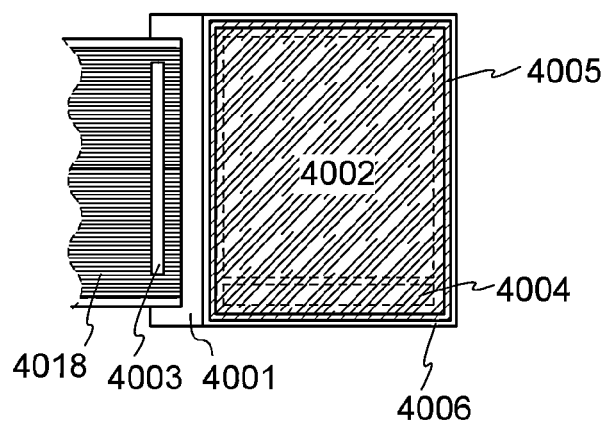

In FIGS. 10B and 10C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a display element, by the first substrate 4001, the sealant 4005, and the second substrate 4006. In FIGS. 10B and 10C, the signal line driver circuit 4003 is formed using a single-crystal semiconductor or a polycrystalline semiconductor over a substrate prepared separately, and mounted in a region different from the region surrounded by the sealant 4005 over the first substrate 4001. In FIGS. 10B and 10C, various signals and potentials are supplied to the separately formed signal line driver circuit 4003, the scan line driver circuit 4004, or the pixel portion 4002 from an FPC 4018.

Although FIGS. 10B and 10C each show the example in which the signal line driver circuit 4003 is formed separately and mounted on the first substrate 4001, the present invention is not limited to this structure. The scan line driver circuit may be separately formed and then mounted, or part of the signal line driver circuit or part of the scan line driver circuit may be separately formed and then mounted.

Note that as a method for mounting a separately formed driver circuit, a known mounting method such as a chip on glass (COG) method, a wire bonding method, or a tape carrier packaging (TCP) method can be used. FIG. 10A shows an example in which the signal line driver circuit 4003 and the scan line driver circuit 4004 each of which is formed over a substrate separately formed are mounted by a COG method. FIG. 10B shows an example in which the signal line driver circuit 4003 which is formed over a substrate separately formed is mounted by a COG method. FIG. 10C shows an example in which the signal line driver circuit 4003 which is formed over a substrate separately formed is mounted by a TCP method.

The display device includes, in its category, a panel in which a display element is sealed, and a module in which an IC or the like including a controller is mounted on the panel.

Note that a display device in this specification means an image display device, a display device, or a light source (including a lighting device). The display device also includes the following modules in its category: a module to which a connector such as an FPC or a TCP is attached; a module having an FPC or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or voltage, and specifically includes, in its category, an inorganic electroluminescent (EL) element, an organic EL element, and the like. Furthermore, a display medium whose contrast is changed by an electric effect, such as electronic ink, can be used.

As illustrated in FIGS. 11A and 11B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed of the same conductive layer as a first electrode layer 4030. The terminal electrode 4016 is formed of the same conductive film as a source electrode and a drain electrode of transistors 4010 and 4011.

Each of the pixel portion 4002 and the scan line driver circuit 4004 provided over the first substrate 4001 includes a plurality of transistors. In FIGS. 11A and 11B, the transistor 4010 included in the pixel portion 4002 and the transistor 4011 included in the scan line driver circuit 4004 are shown as an example. In FIG. 11A, an insulating layer 4020 is formed over the transistors 4010 and 4011. In FIG. 11B, a planarization layer 4021 is further provided over an insulating layer 4024. Note that an insulating layer 4023 is an insulating layer serving as a base layer.

In this embodiment, any of the transistors described in the above embodiments can be applied to the transistors 4010 and 4011.

Variation in the electric characteristics of the transistors described in the above embodiments is suppressed and the transistors are electrically stable. As described above, a semiconductor device with high reliability as the semiconductor devices illustrated in FIGS. 11A and 11B can be obtained.

FIG. 11B illustrates an example in which a conductive layer 4017 is provided over the insulating layer 4024 so as to overlap with a channel formation region of the oxide semiconductor layer of the transistor 4011 for the driver circuit. In this embodiment, the conductive layer 4017 is formed using the same layer as the first electrode layer 4030. The conductive layer 4017 is provided at the position overlapping with the channel formation region of the oxide semiconductor layer, whereby the amount of change in the threshold voltage of the transistor 4011 between before and after a BT test can be further reduced. The conductive layer 4017 may have the same potential as or a potential different from that of a gate electrode layer of the transistor 4011, and the conductive layer 4017 can function as a second gate electrode layer. The potential of the conductive layer 4017 may be GND, 0 V, or in a floating state.

In addition, the conductive layer 4017 has a function of blocking an external electric field. In other words, the conductive layer 4017 has a function of preventing an external electric field (particularly, a function of preventing static electricity) from affecting the inside (a circuit portion including a thin film transistor). A blocking function of the conductive layer 4017 can prevent variation in electric characteristics of the transistor due to the effect of external electric field such as static electricity. The conductive layer 4017 can be used for any of the transistors described in the above embodiments.

The transistor 4010 provided in the pixel portion 4002 is electrically connected to the display element to constitute a display panel. A variety of display elements can be used as the display element as long as display can be performed.

An example of a liquid crystal display device using a liquid crystal element as a display element is illustrated in FIG. 11A. In FIG. 11A, a liquid crystal element 4013 is a display element including the first electrode layer 4030, a second electrode layer 4031, and a liquid crystal layer 4008. Note that insulating layers 4032 and 4033 serving as alignment films are provided so that the liquid crystal layer 4008 is interposed therebetween. The second electrode layer 4031 is formed on the second substrate 4006 side. The second electrode layer 4031 overlaps with the first electrode layer 4030 with the liquid crystal layer 4008 interposed therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases generated just before a cholesteric phase changes into an isotropic phase while temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the liquid crystal display device can be manufactured with improved productivity. A transistor using an oxide semiconductor layer has the possibility that electrical characteristics of the transistor may significantly change and deviate from the designed range by the influence of static electricity. Therefore, it is more effective to use a liquid crystal material exhibiting a blue phase for the liquid crystal display device including a transistor which uses an oxide semiconductor layer.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. Note that the specific resistivity in this specification is measured at 20° C.

In the transistor used in this embodiment, which uses a highly-purified oxide semiconductor layer, the current in an off state (the off-state current) can be made small. Therefore, an electrical signal such as an image signal can be held for a long period, and a writing interval can be set long when the power is on. Consequently, frequency of refresh operation can be reduced, which leads to an effect of suppressing power consumption.

The size of a storage capacitor provided in the liquid crystal display device is set considering the leakage current of the transistor provided in the pixel portion or the like so that charge can be held for a predetermined period. The size of the storage capacitor may be set considering the off-state current of the transistor or the like. Since the transistor including a high-purity oxide semiconductor layer is used, a storage capacitor having capacitance which is ⅓ or less, preferably ⅕ or less with respect to a liquid crystal capacitance of each pixel is sufficient to be provided.

The field-effect mobility of the transistor including the above-described oxide semiconductor layer can be relatively high, whereby high-speed operation is possible. Thus, by using the above-described transistor in a pixel portion of a semiconductor device having a display function, a high-quality image can be provided. In addition, since a driver circuit portion and the pixel portion can be formed over one substrate, the number of components of the semiconductor device can be reduced.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, and the like can be used.

A normally black liquid crystal display device such as a transmissive liquid crystal display device utilizing a vertical alignment (VA) mode is preferable. The vertical alignment mode is a method for controlling alignment of liquid crystal molecules of a liquid crystal display panel, in which liquid crystal molecules are aligned vertically to a panel surface when no voltage is applied. Some examples are given as a vertical alignment mode, for example, a multi-domain vertical alignment (MVA) mode, a patterned vertical alignment (PVA) mode, an advanced super view (ASV) mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. A backlight, a side light, or the like may be used as a light source.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. Then, a transistor and a light-emitting element are formed over a substrate. The light-emitting element can have any of the following structures: a top emission structure in which light is extracted through the surface opposite to the substrate; a bottom emission structure in which light is extracted through the surface on the substrate side; and a dual emission structure in which light is extracted through the surface opposite to the substrate and the surface on the substrate side.

An example of a light-emitting device using a light-emitting element as a display element is illustrated in FIG. 11B. A light-emitting element 4513 which is a display element is electrically connected to the transistor 4010 provided in the pixel portion 4002. The light-emitting element 4513 has a stacked-layer structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening portion over the first electrode layer 4030 so that a sidewall of the opening portion is formed as a tilted surface with continuous curvature.

The electroluminescent layer 4511 may be formed with either a single layer or a stacked layer of a plurality of layers.

A protective layer may be formed over the second electrode layer 4031 and the partition wall 4510 in order to prevent entry of oxygen, hydrogen, moisture, carbon dioxide, or the like into the light-emitting element 4513. As the protective layer, a silicon nitride film, a silicon nitride oxide film, an aluminum oxide film, an aluminum nitride film, an aluminum oxynitride film, an aluminum nitride oxide film, a DLC film, or the like can be formed. In a space sealed with the first substrate 4001, the second substrate 4006, and the sealant 4005, a filler 4514 is provided and tightly sealed. It is preferable that the light-emitting element be packaged (sealed) with a cover material with high air-tightness and little degasification or a protective film (such as a laminate film or an ultraviolet curable resin film) so that the light-emitting element is not exposed to the outside air, in this manner.

As the filler 4514, an ultraviolet curable resin or a thermosetting resin can be used as well as an inert gas such as nitrogen or argon, and polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

A light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, can be used for the first electrode layer 4030 and the second electrode layer 4031.

The first electrode layer 4030 and the second electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor tends to be broken due to static electricity or the like, a protective circuit for protecting the driver circuit is preferably provided. The protective circuit is preferably formed using a nonlinear element.

As described above, by using any of the transistors described in the above embodiments, a semiconductor device having a display function and high reliability can be provided.

This embodiment can be combined with any of the other embodiments as appropriate.

[Embodiment 7]

A semiconductor device having an image sensor function for reading data of an object can be manufactured with any of the transistors described in the above embodiments.

Figure 12A:
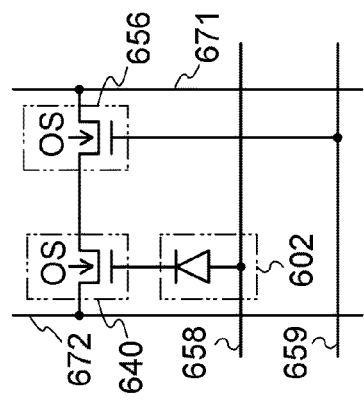
FIGS. 12A and 12B illustrate an equivalent circuit and a structure of a semiconductor device.

FIG. 12A shows an example of a semiconductor device having an image sensor function. FIG. 12A is an equivalent circuit of a photo sensor and FIG. 12B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor using an oxide semiconductor layer is denoted by a symbol "OS" so that it can be identified as a transistor including an oxide semiconductor layer. In FIG. 12A, the transistors described in the above embodiments can be applied to the transistor 640 and the transistor 656, and the transistors 640 and 656 are each a transistor using an oxide semiconductor for a semiconductor layer in which a channel is formed. In this embodiment, an example in which a transistor having a structure similar to that of the transistor 140 described in Embodiment 4 is used is described. The transistor 640 is an inverted staggered transistor which has a bottom-gate structure and in which an insulating layer functioning as a channel protective film is provided over an oxide semiconductor layer.

Figure 12B:
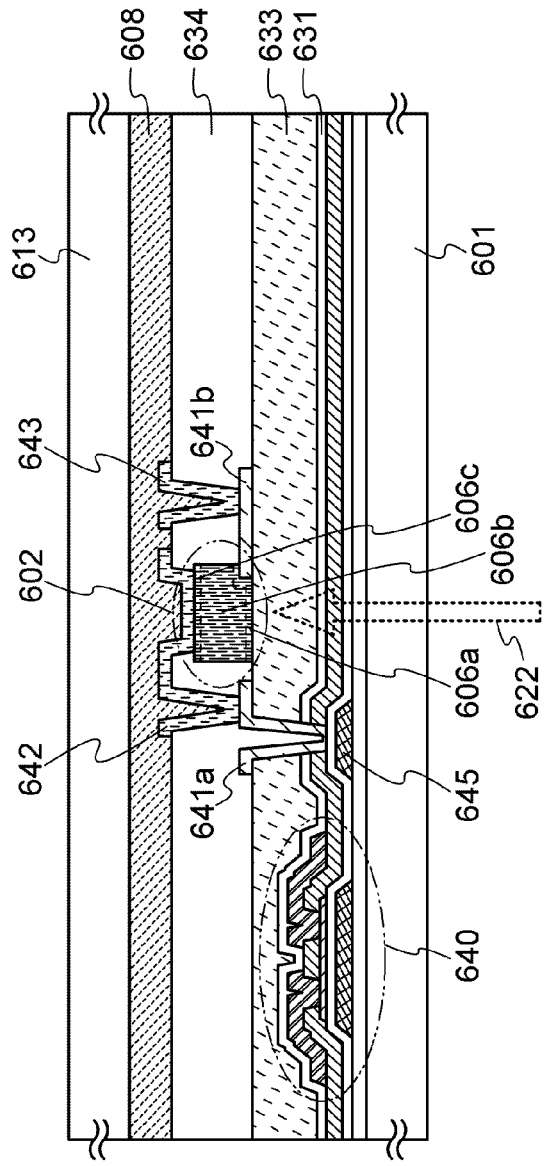

FIG. 12B is a cross-sectional view illustrating structure examples of the photodiode 602 and the transistor 640 in a photo sensor. The photodiode 602 functioning as a sensor and the transistor 640 are provided over a substrate 601 having an insulating surface (a TFT substrate). A substrate 613 is provided over the photodiode 602 and the transistor 640 with the use of an adhesive layer 608.

An insulating layer 631, an insulating layer 633, and an insulating layer 634 are provided over the transistor 640. The photodiode 602 is provided over the insulating layer 633. In the photodiode 602, a first semiconductor layer 606a, a second semiconductor layer 606b, and a third semiconductor layer 606c are sequentially stacked from the insulating layer 633 side between an electrode layer 642 formed over the insulating layer 634 and each of electrodes 641a and 641b formed over the insulating layer 633.

The electrode 641b is electrically connected to a conductive layer 643 formed over the insulating layer 634, and the electrode layer 642 is electrically connected to a conductive layer 645 through the electrode 641a. The conductive layer 645 is electrically connected to a gate electrode layer of the transistor 640, and the photodiode 602 is electrically connected to the transistor 640.

Here, a PIN photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is shown as an example.

The first semiconductor layer 606a is a p-type semiconductor layer and can be formed using amorphous silicon containing an impurity element imparting p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced into the amorphous silicon film with use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor film formation method, a sputtering method, or the like may be used. The first semiconductor layer 606a is preferably formed to have a thickness of greater than or equal to 10 nm and smaller than or equal to 50 nm.

The second semiconductor layer 606b is an i-type semiconductor layer (intrinsic semiconductor layer) and is formed using amorphous silicon. As for the formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor film formation method, a sputtering method, or the like. The second semiconductor layer 606b is preferably formed to have a thickness of greater than or equal to 200 nm and smaller than or equal to 1000 nm.

The third semiconductor layer 606c is an n-type semiconductor layer and is formed using amorphous silicon containing an impurity element imparting n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced into the amorphous silicon film with use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor film formation method, a sputtering method, or the like may be used. The third semiconductor layer 606c is preferably formed to have a thickness of greater than or equal to 20 nm and smaller than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor, a microcrystalline semiconductor, or a semi-amorphous semiconductor (SAS).

Since the mobility of holes generated by the photoelectric effect is lower than that of electrons, a PIN photodiode has better characteristics when a surface on the p-type semiconductor layer side is used as a light-receiving plane. Here, an example where light 622 received by the photodiode 602 from a surface of the substrate 601, over which a PIN photodiode is formed, is converted into electric signals is described. Light approaching the semiconductor layer side having a conductivity type opposite from that of the semiconductor layer side on the light-receiving plane is disturbance light; therefore, the electrode layer is preferably formed from a light-blocking conductive layer. A surface of the n-type semiconductor layer side can alternatively be used as the light-receiving plane.

With the use of an insulating material, the insulating layer 631, the insulating layer 633, and the insulating layer 634 can be formed, depending on the material, with a method such as a sputtering method, a plasma CVD method, an SOG method, spin coating, dipping, spray coating, a droplet discharge method (e.g., an inkjet method), or a pronting method (e.g., screen printing or offset printing).

As the insulating layer 631, a single layer or a stacked layer of an oxide insulating layer such as a silicon oxide layer, a silicon oxynitride layer, an aluminum oxide layer, an aluminum oxynitride layer, or the like and a nitride insulating layer such as a silicon nitride layer, a silicon nitride oxide layer, an aluminum nitride layer, an aluminum nitride oxide layer, or the like can be used.

In this embodiment, an aluminum oxide film is used as the insulating layer 631. The insulating layer 631 can be formed by a sputtering method.

The aluminum oxide film provided as the insulating layer 631 over the oxide semiconductor layer has a high blocking effect that neither oxygen nor an impurity such as hydrogen or moisture passes through the film.

Accordingly, the aluminum oxide film serves as a protective layer that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after the manufacturing process.

For reduction of the surface roughness, an insulating layer functioning as a planarization layer is preferably used as the insulating layers 633 and 634. For the insulating layers 633 and 634, an organic insulating material having heat resistance such as polyimide, an acrylic resin, a benzocyclobutene resin, polyamide, or an epoxy resin can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

By detecting light entering the photodiode 602, data of an object can be read. Note that a light source such as a backlight can be used at the time of reading data of an object.

Variation in the electric characteristics of the above-described transistors is suppressed and the transistors are electrically stable. Thus, a highly reliable semiconductor device including the transistor 640 having stable electric characteristics can be provided. Further, the highly reliable semiconductor device can be manufactured at a high yield, whereby high productivity is achieved.

The structures and methods described in this embodiment can be combined as appropriate with any of the structures and methods described in the other embodiments.

[Embodiment 8]

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset, a portable game machine, a portable information terminal, an audio reproducing device, a game machine (e.g., a pachinko machine or a slot machine), a game console, and the like. Specific examples of these electronic devices are shown in FIGS. 13A to 13C.

Figure 13A:
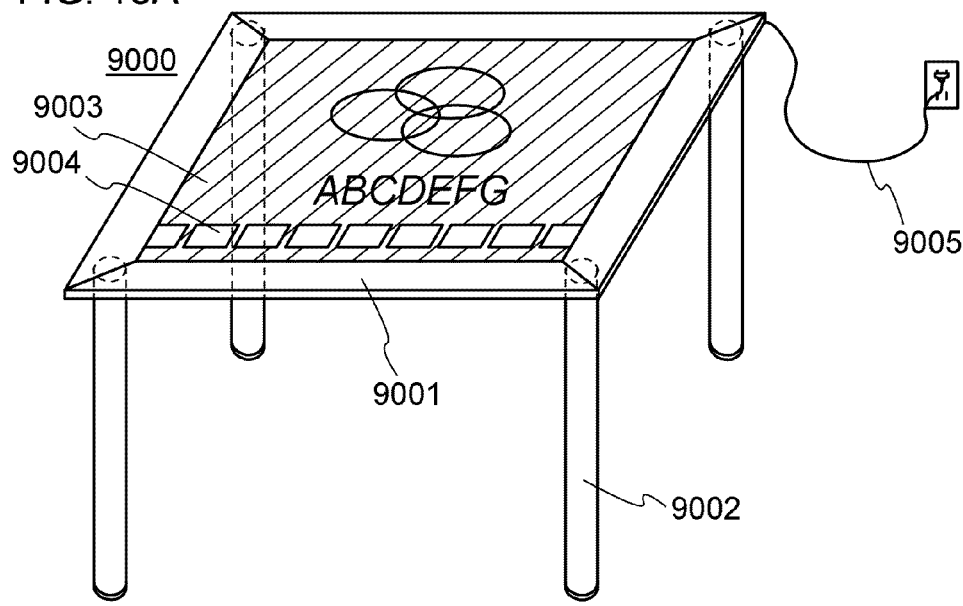
FIGS. 13A to 13C illustrate electronic devices.
Figure 13B:
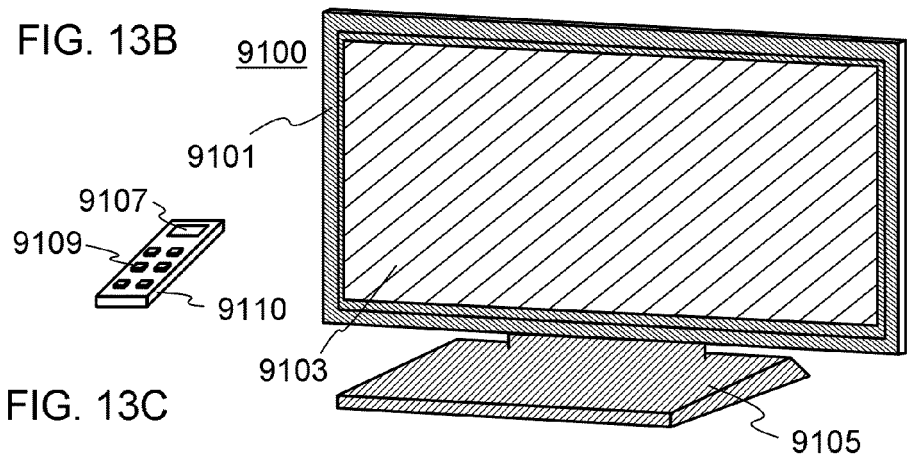
Figure 13C:
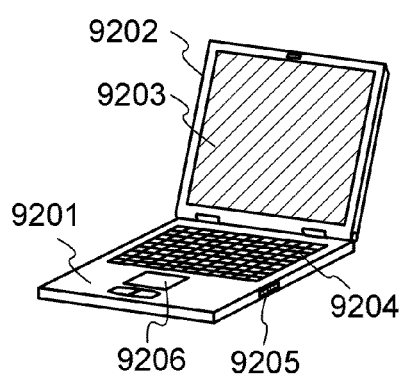

FIG. 13A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 4 can be used for the display portion 9003 so that the electronic device can have a high reliability.

The display portion 9003 has a touch input function. By touching a display button 9004 displayed on the display portion 9003 of the table 9000 with a finger or the like, a screen can be operated or data can be input. Further, when communication with or control of another home appliance is possible, the display portion 9003 may function as a control device for controlling the home appliance by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 13B illustrates an example of a television set 9100. In the television set 9100, a display portion 9103 is incorporated in a housing 9101 and an image can be displayed on the display portion 9103. Further, the housing 9101 is supported by a stand 9105 in FIG. 13B.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Further, the remote controller 9110 may be provided with a display portion 9107 for displaying data output from the remote controller 9110.

Note that the television set 9100 illustrated in FIG. 13B is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

The semiconductor device described in any of Embodiments 1 to 4 can be used for the display portions 9103 and 9107 so that the television set and the remote controller can have a high reliability.

FIG. 13C illustrates a computer which includes a main body 9201, a housing 9202, a display portion 9203, a keyboard 9204, an external connection port 9205, a pointing device 9206, and the like. The computer includes a semiconductor device manufactured according to one embodiment of the present invention for the display portion 9203. By using the semiconductor device described in the above embodiment, a computer with high reliability can be provided.

Figure 14A:
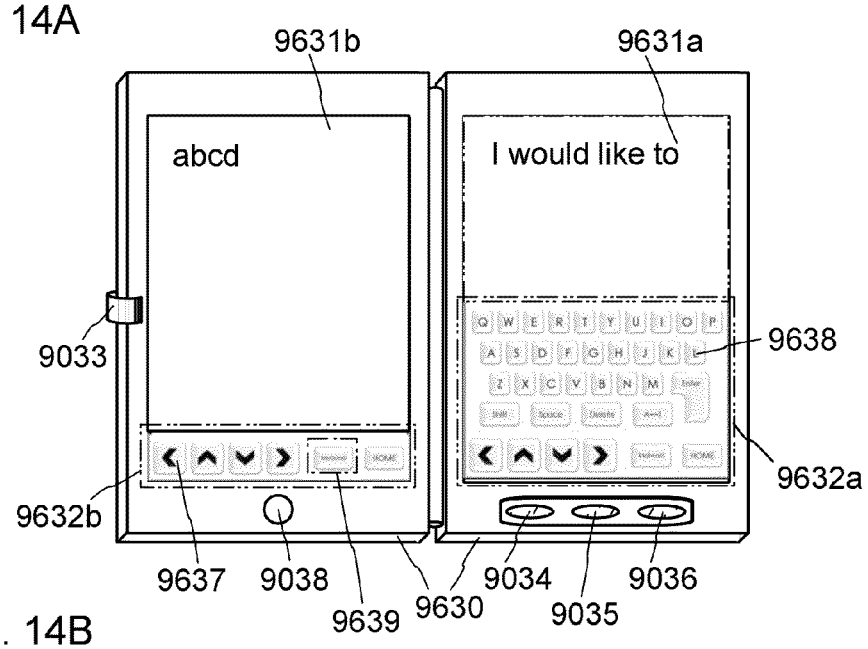
FIGS. 14A to 14C are diagrams illustrating an electronic device and a block diagram of a charge/discharge control circuit.
Figure 14B:
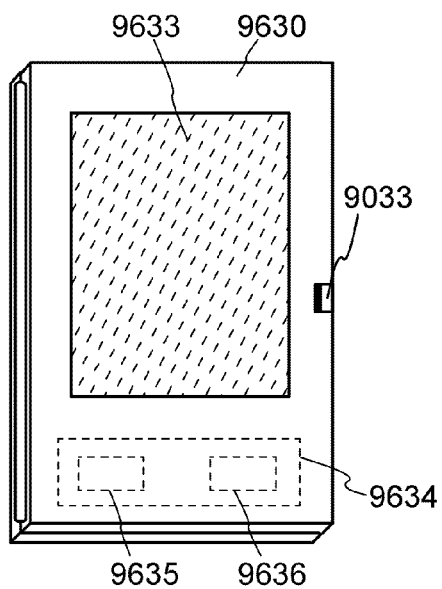

FIGS. 14A and 14B illustrate a tablet that can be folded in two. FIG. 14A illustrates the tablet which is open. The tablet includes a housing 9630, a display portion 9631a, a display portion 9631b, a switch 9034 for switching display modes, a power switch 9035, a switch 9036 for switching to power-saving mode, a fastener 9033, and an operation switch 9038.

The semiconductor device described in any of Embodiments 1 to 4 can be used for the display portion 9631a and the display portion 9631b so that the tablet can have a high reliability.

Part of the display portion 9631a can be a touch panel region 9632a, and data can be input by touching operation keys 9638 that are displayed. Note that FIG. 14A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. By touching the place where a button 9639 for switching to keyboard display is displayed in the touch panel with a finger, a stylus, or the like, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although FIG. 14A shows the example where the display area of the display portion 9631a is the same as that of the display portion 9631b, there is no particular limitation on the display portions 9631a and 9631b. They may differ in size and/or image quality. For example, one of them may be a display panel that can display higher-definition images than the other.

FIG. 14B illustrates the tablet which is closed. The tablet includes the housing 9630, a solar battery 9633, a charge/discharge control circuit 9634, a battery 9635, and a DC to DC converter 9636. As an example, FIG. 14B illustrates the charge/discharge control circuit 9634 including the battery 9635 and the DC to DC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet illustrated in FIGS. 14A and 14B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet, supplies electric power to a touch panel, a display portion, an image signal processor, and the like. Note that the solar battery 9633 can be provided on one or two surfaces of the housing 9630, so that the battery 9635 can be charged efficiently. When a lithium ion battery is used as the battery 9635, there is an advantage of downsizing or the like.

Figure 14C:
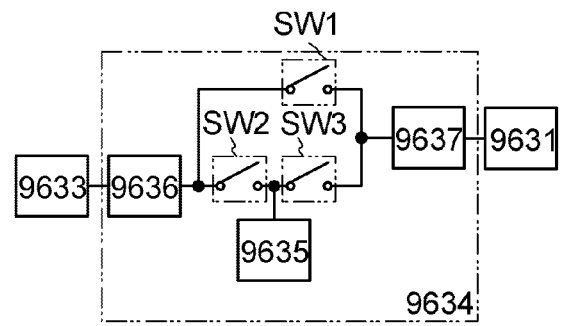

The structure and operation of the charge/discharge control circuit 9634 illustrated in FIG. 14B are described with reference to a block diagram in FIG. 14C. FIG. 14C illustrates the solar battery 9633, the battery 9635, the DC to DC converter 9636, a converter 9637, switches SW1 to SW3, and a display portion 9631. The battery 9635, the DC to DC converter 9636, the converter 9637, and the switches SW1 to SW3 correspond to the charge/discharge control circuit 9634 illustrated in FIG. 14B.

An example of the operation performed when power is generated by the solar battery 9633 using external light is described. The voltage of power generated by the solar battery 9633 is raised or lowered by the DC to DC converter 9636 so as to be a voltage for charging the battery 9635. Then, when power from the solar battery 9633 is used for the operation of the display portion 9631, the switch SW1 is turned on and the voltage of the power is raised or lowered by the converter 9637 so as to be a voltage needed for the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures and methods described in this embodiment can be combined as appropriate with any of the structures and methods described in the other embodiments.

This application is based on Japanese Patent Application Serial No. 2011-247941 filed with Japan Patent Office on Nov. 11, 2011, the entire contents of which are hereby incorporated by reference.

What is claimed is:

1. A semiconductor device comprising:
   a first insulating layer;
   a gate electrode;
   a gate insulating layer;
   an oxide semiconductor layer including a channel; and
   a protective layer,
   wherein the gate insulating layer overlaps with the first insulating layer with the gate electrode therebetween;
   wherein the oxide semiconductor layer overlaps with the gate electrode with the gate insulating layer interposed therebetween,
   wherein the protective layer overlaps with the gate insulating layer with the oxide semiconductor layer interposed therebetween,
   wherein the protective layer includes an oxide material containing In, an element M, and Zn,
   wherein the element M is a Group 3A element, a Group 4A element, or a Group 4B element,
   wherein the protective layer extends beyond an end portion of the oxide semiconductor layer in a channel width direction,
   wherein a hydrogen concentration of the first insulating layer is lower than or equal to $1 \times 10^{18}$ atoms/cm$^3$, and
   wherein a hydrogen concentration of the gate insulating layer is lower than or equal to $1 \times 10^{18}$ atoms/cm$^3$.

2. The semiconductor device according to claim 1, wherein the protective layer includes a material which contains the element M and is represented by a chemical formula InMZnO$_X$ (X>0).

3. The semiconductor device according to claim 1, wherein the element M is Ti, Zr, Hf, Ge, Ce, or Y.

4. The semiconductor device according to claim 1, wherein the protective layer includes an oxide semiconductor having a higher insulating property than the oxide semiconductor layer.

5. The semiconductor device according to claim 1, wherein the semiconductor device is one selected from the group consisting of a table having a display portion, a television set, a computer, and a tablet.

6. A semiconductor device comprising:
   a first insulating layer;
   a gate electrode;
   a gate insulating layer;
   an oxide semiconductor layer including a channel; and
   a protective layer, wherein the gate insulating layer overlaps with the first insulating layer with the gate electrode therebetween;

wherein the oxide semiconductor layer overlaps with the gate electrode with the gate insulating layer interposed therebetween, wherein the protective layer overlaps with the gate insulating layer with the oxide semiconductor layer interposed therebetween, wherein the protective layer includes an oxide material containing In, an element $M_1$, an element $M_2$, and Zn, wherein the element $M_1$ is a Group 3B element, wherein the element $M_2$ is a Group 3A element, a Group 4A element, or a Group 4B element, wherein the protective layer extends beyond an end portion of the oxide semiconductor layer in a channel width direction, wherein a hydrogen concentration of the first insulating layer is lower than or equal to $1 \times 10^{18}$ atoms/cm$^3$, and wherein a hydrogen concentration of the gate insulating layer is lower than or equal to $1 \times 10^{18}$ atoms/cm$^3$.

7. The semiconductor device according to claim 6, wherein the protective layer includes a material which contains the element $M_1$ and the element $M_2$ and is represented by a chemical formula $InM_{1X}M_{2(1-X)}ZnO$ ($0<X<1+\alpha$ where $\alpha$ is less than 0.3 and $(1-X)>0$).

8. The semiconductor device according to claim 6, wherein the element $M_1$ is Ga.

9. The semiconductor device according to claim 6, wherein the element $M_2$ is Ti, Zr, Hf, Ge, Ce, or Y.

10. The semiconductor device according to claim 6, wherein the protective layer includes an oxide semiconductor having a higher insulating property than the oxide semiconductor layer.

11. The semiconductor device according to claim 6, wherein the semiconductor device is one selected from the group consisting of a table having a display portion, a television set, a computer, and a tablet.

12. The semiconductor device according to claim 1,
wherein the first insulating layer comprises an aluminum material, and
wherein the gate insulating layer comprises an aluminum material.

13. The semiconductor device according to claim 6,
wherein the first insulating layer comprises an aluminum material, and
wherein the gate insulating layer comprises an aluminum material.

* * * * *